(12) United States Patent
Yoon et al.

(10) Patent No.: US 11,222,990 B2
(45) Date of Patent: Jan. 11, 2022

(54) SOLAR CELL MODULE

(71) Applicant: TOPSUN CO., LTD, Jeollanam-do (KR)

(72) Inventors: Jeong Taek Yoon, Gwangju (KR); Jong Suk Gil, Gwangju (KR); Jung Hoon Kim, Gwangju (KR)

(73) Assignee: TOPSUN CO., LTD, Jangseong-gun (KR)

( * ) Notice: Subject to any disclaimer, the term of this patent is extended or adjusted under 35 U.S.C. 154(b) by 188 days.

(21) Appl. No.: 16/481,088

(22) PCT Filed: Mar. 6, 2017

(86) PCT No.: PCT/KR2017/002359
§ 371 (c)(1),
(2) Date: Jul. 26, 2019

(87) PCT Pub. No.: WO2018/155752
PCT Pub. Date: Aug. 30, 2018

(65) Prior Publication Data
US 2021/0135031 A1    May 6, 2021

(30) Foreign Application Priority Data
Feb. 22, 2017    (KR) .......................... 10-2017-0023243

(51) Int. Cl.
*H01L 31/05*    (2014.01)
*H01L 31/043*    (2014.01)
(Continued)

(52) U.S. Cl.
CPC ...... *H01L 31/0504* (2013.01); *H01L 31/0201* (2013.01); *H01L 31/043* (2014.12); *H01L 31/022433* (2013.01)

(58) Field of Classification Search
CPC ............. H01L 31/0504; H01L 31/0201; H01L 31/043; H01L 31/022433
See application file for complete search history.

(56) References Cited

U.S. PATENT DOCUMENTS

2013/0213451 A1    8/2013    Nakauchi et al.
2016/0172510 A1*   6/2016    Bitnar ................ H01L 31/0684
                                                                136/244
(Continued)

FOREIGN PATENT DOCUMENTS

JP    2003-069055 A    3/2003
KR    10-2010-0031469 A    3/2010
(Continued)

OTHER PUBLICATIONS

International Search Report dated Nov. 8, 2017 in related International Patent Application No. PCT/KR2017/002359.
(Continued)

*Primary Examiner* — Devina Pillay
(74) *Attorney, Agent, or Firm* — Eric L. Lane; Green Patent Law

(57) ABSTRACT

The present invention relates to a solar cell module and, more specifically, to a solar cell module in which solar cells are disposed to partially overlap each other so as to increase a space occupancy ratio of the solar cells and which is capable of solving safety and structural problems caused by the solar cells being disposed to overlap each other. In the solar cell module according to the present invention, the solar cells are disposed to partially overlap each other, thereby reducing a reactive power region and concurrently increasing a space occupancy ratio of the solar cells to increase power generation efficiency. In addition, a gap between portions at which the solar cells overlap each other is reduced to considerably reduce an incidence rate of cracks (Continued)

and damage, thereby improving stability and structural performance.

6 Claims, 24 Drawing Sheets

(51) Int. Cl.
*H01L 31/02* (2006.01)
*H01L 31/0224* (2006.01)

(56) References Cited

U.S. PATENT DOCUMENTS

2018/0158970 A1* 6/2018 Yoon ............... H01L 31/022441
2018/0198008 A1* 7/2018 Tripp .................. H01L 31/0512
2019/0386164 A1* 12/2019 Shi ..................... H01L 31/0201

FOREIGN PATENT DOCUMENTS

| KR | 10-2012-0062431 A | 6/2012 |
| KR | 10-2015-0084891 A | 7/2015 |

OTHER PUBLICATIONS

Written Opinion in related International Patent Application No. PCT/KR2017/002359.

* cited by examiner

SOLAR CELL MODULE

TECHNICAL FIELD

The present invention relates to a solar cell module, and more specifically, to a solar cell module in which solar cells are disposed to partially overlap each other so as to increase a space occupancy ratio of the solar cells and which is capable of solving safety and structural problems caused by the solar cells being disposed to overlap each other.

BACKGROUND ART

Solar cells convert solar energy into electric energy using a photoelectric conversion effect, and one solar cell generates small power of about several watts (W). Therefore, in order to obtain a desired output, a plurality of solar cells are disposed and arranged in a certain pattern and are connected in series or in parallel, and then a waterproof solar cell module is used.

In a solar cell module, generally, glass is disposed on a front surface thereof and an ethylene vinyl acetate (EVA) sheet and a string line are disposed on a rear surface thereof. In addition, EVA and back sheets for protecting a cell are disposed on a rear surface of the cell, and a lamination process is performed thereon. A junction box including wires for transmitting electricity to the outside is attached to a laminated module, and a process of attaching a frame to facilitate the installation of the module protecting the module is performed.

In the conventional solar cell module as described above, in order to output power generated by the solar cell to the outside, a method is used which outputs the power to the outside of the solar cell module through a busbar, an interconnection ribbon, and a lead wire formed in the solar cell.

However, in order to connect a plurality of solar cells to each other in series, the conventional solar cell module has a structure in which one end of the interconnection ribbon is attached to a positive electrode of one side solar cell and the other end of the interconnection ribbon is attached to a negative electrode of the other side solar cell adjacent thereto, a region for installing the interconnection ribbon, that is, a spacing distance between the solar cells, is present to form a reactive power area that does not contribute to power generation. There is a problem in that an occupancy ratio of the solar cell is lowered due to the reactive power area.

In order to solve the problem, conventionally, there has been proposed a structure in which solar cells are disposed to overlap each other. However, in such a conventional structure, since a relatively large gap is formed between overlapping portions due to thicknesses of a busbar and an interconnection ribbon formed on a front surface of a solar cell disposed at a lower side and a busbar electrode formed on a rear surface of a solar cell disposed at an upper side, there is a problem in that the solar cell is easily damaged or cracks are generated when an external force such as an impact or pressure is applied.

DISCLOSURE

Technical Problem

The present invention is directed to providing a solar cell module capable of solving a structural problem such as cracks, damage, or the like caused by a gap between solar cells in a solar cell module in which the solar cells are disposed to overlap each other so as to reduce a distance between the solar cells and increase a space occupancy ratio of the solar cells.

Technical Solution

According to an embodiment of the present invention, a solar cell module includes a plurality of finger electrodes and a front busbar electrode which are formed on a front surface thereof, wherein the front busbar electrode connects the finger electrodes; a rear busbar electrode which is formed on a rear surface thereof; a plurality of solar cells which are disposed adjacent to each other in an extending direction of the front busbar electrode; and an interconnection ribbon which connects the front busbar electrode of one side solar cell and the rear busbar electrode of the other side solar cell, wherein the solar cells are disposed such that an edge of a front surface of the one side solar cell partially overlaps an edge of a rear surface of the other side solar cell.

The rear busbar electrode of the solar cell may be removed from an edge of the solar cell to a certain length, an aluminum layer thicker than the rear busbar electrode may be formed on a rear surface of the solar cell excluding the rear busbar electrode, and a partial region of the aluminum layer in a direction from the edge of the rear surface of the solar cell to the rear busbar electrode or a region of the aluminum layer between the edge of the rear surface of solar cell and an end of the rear busbar electrode may be formed to have a thickness less than or equal to a thickness of the rear busbar electrode or may be removed.

An insertion groove or a through-hole may be formed in an insertion region which is formed to have a thickness less than or equal to the thickness of the rear busbar electrode or is removed, wherein the insertion groove is formed by removing a portion of the solar cell below the aluminum layer to a certain depth such that a portion of the interconnection ribbon is inserted thereinto and the through-hole is formed to pass through an entirety of the solar cell below the aluminum layer such that the interconnection ribbon passes therethrough. In this case, the insertion groove or the through-hole may be formed at a position opposite to a position of a branch busbar electrode, a through-hole or an insertion groove, and a support portion formed on a front surface of the solar cell.

A support potion may be further provided at the edge of the front surface of the one side solar cell to support the edge of the rear surface of the other side solar cell.

At least one end of both ends of the front busbar electrode may be removed from an edge of the solar cell to a certain distance, and a pair of branch busbar electrodes may be further provided on a front surface of the solar cell so as to be branched and extended by a certain length to the edge of the solar cell from the one end of the front busbar electrode which is removed to the certain length.

A finger electrode disposed at an outermost side among the finger electrodes disposed on the front surface of the solar cell is formed at a position spaced a certain distance inward from an edge of the solar cell. The branch busbar electrode extends from an end of the front busbar electrode to the finger electrode disposed at the outermost side.

An insertion groove or a through-hole may be formed in the solar cell between the branch busbar electrodes, wherein the insertion groove is recessed downward by a certain depth such that a portion of the interconnection ribbon is inserted thereinto and the through-hole vertically passes through the solar cell such that the interconnection ribbon passes therethrough.

An original solar cell manufactured to have a set size may be cut in a direction orthogonal to the extending direction of the front busbar electrode to form the plurality of solar cells.

Advantageous Effects

In a solar cell module according to the present invention, solar cells are disposed to partially overlap each other, thereby reducing a reactive power region and concurrently increasing a space occupancy ratio of the solar cells to increase power generation efficiency. In addition, a gap between portions at which the solar cells overlap each other is reduced to considerably reduce an incidence rate of cracks and damage, thereby improving stability and structural performance.

MODES OF THE INVENTION

Hereinafter, a solar cell module according to exemplary embodiments of the present invention will be described in detail with reference to the accompanying drawings.

Figure 1:
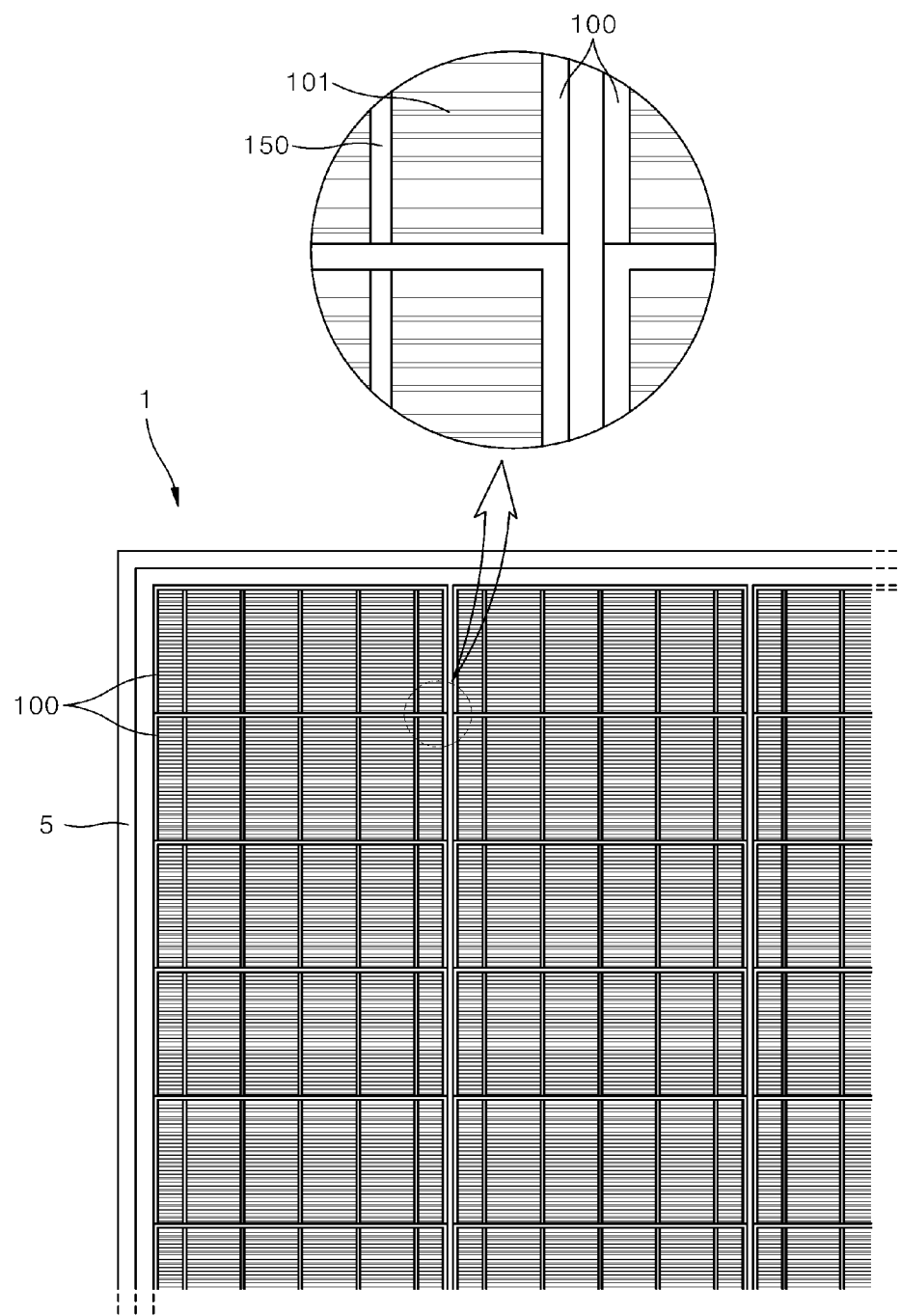
FIG. 1 is a plan view illustrating a portion of a solar cell module according to an embodiment of the present invention.
Figure 2:
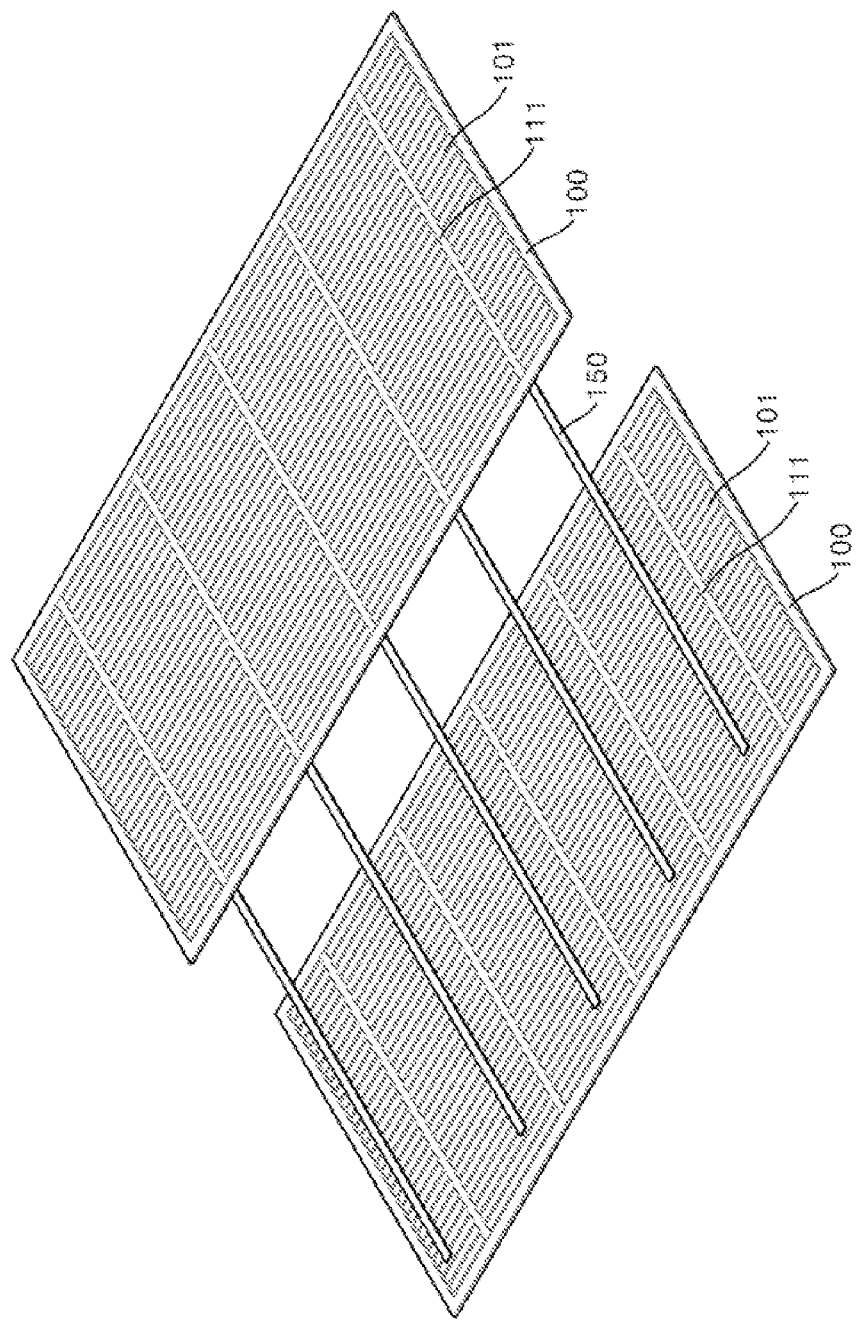
FIG. 2 is an exploded perspective view illustrating the solar cell module according to the embodiment of the present invention shown in FIG. 1.
Figure 3:
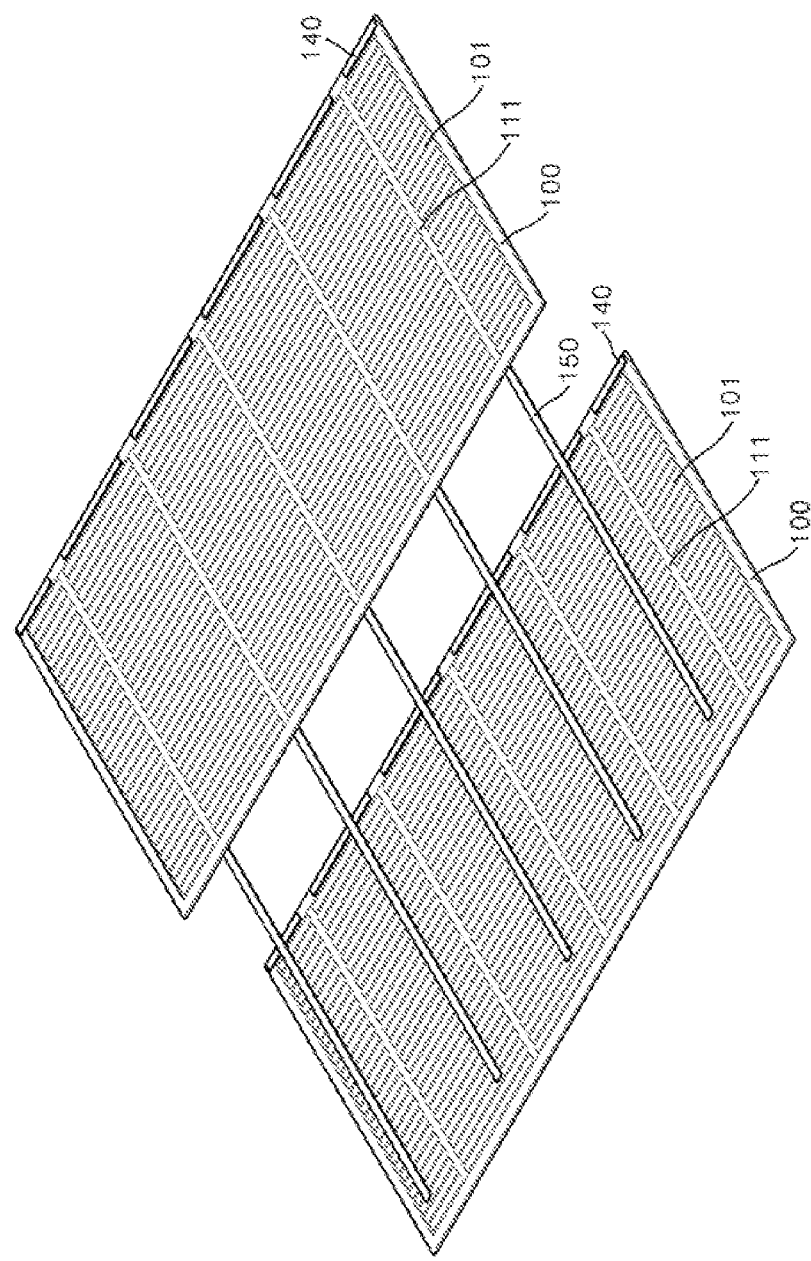
FIG. 3 is an exploded perspective view illustrating the solar cell module further including a support portion.

FIGS. 1 to 3 illustrate a solar cell module 1 according to the present invention.

Referring to FIGS. 1 to 3, the solar cell module 1 according to the present invention includes a plurality of solar cells 100, a support portion 140, an interconnection ribbon 150, a transparent substrate (for example, tempered glass) configured to protect a front surface of the solar cell 100, an upper protective layer and a lower protective layer disposed to surround the solar cell 100, and a back sheet and a frame 5 which are disposed below the lower protective layer.

The solar cells 100 are disposed such that a certain region of a front surface of an edge of one side solar cell overlaps a certain region of a rear surface of an edge of the other side solar cell 100 in an extending direction of a front busbar electrode 111.

A finger electrode 101 and the front busbar electrode 111 are formed on a front surface of the solar cell 100, and a rear busbar electrode (not shown) is formed at a position corresponding to the front busbar electrode 111 on a rear surface of the solar cell 100 in a direction parallel to the extending direction of the front busbar electrode 111.

A plurality of finger electrodes 101 are disposed on a front surface of a solar cell 100 so as to be spaced apart from each other by a certain distance. A finger electrode 101, which is disposed at a peripheral portion among the finger electrodes 101, is formed to be spaced a certain distance inward from an edge of the solar cell 100.

The front busbar electrode 111 is disposed to traverse the front surface of the solar cell 100 crosswise or lengthwise. Specifically, a plurality of front busbar electrodes 111 extend in a direction crossing or orthogonal to the extending direction of the finger electrode 101, are disposed to be spaced apart from each other, and connect the finger electrodes 101 formed on the front surface of the solar cell 100. As shown in the drawings, the front busbar electrode 111 may be continuously or intermittently formed to have a certain width.

The rear busbar electrode (not shown) is formed on the rear surface of the solar cell 100 in a direction parallel to the front busbar electrode 111. The rear busbar electrode may also be continuously or intermittently formed. Two to thirty front busbar electrodes 111 and two to thirty rear busbar electrodes of the solar cell 100 may be optionally formed.

As shown in the drawings, the solar cells 100 of the solar cell module 1 according to the present invention are disposed such that a certain region of an edge of a lower end of the one side solar cell 100 overlaps a certain region of an edge of an upper end of the other side solar cell 100. A width of portions overlapping each other may be in a range of 0.1 mm to 2 mm.

The interconnection ribbon 150 is disposed between the front busbar electrode 111 of the one side solar cell 100 and the rear busbar electrode of the other side solar cell 100 to connect the rear busbar electrode of the one side solar cell 100 and the rear busbar electrode of the other side solar cell 100.

The interconnection ribbon 150 is disposed in contact with an upper portion of the front busbar electrode 111 of the solar cell 100 disposed at a lower side, and the rear busbar electrode of the solar cell 100 disposed at an upper side is disposed in contact with an upper portion of the interconnection ribbon 150.

In the solar cell module according to the present invention, the lower protective layer may enter a space, i.e., a gap formed between the rear surface of the solar cell 100 obliquely installed in a lamination process and the lower protective layer, thereby preventing cracks or damage from being generated by an external force such as an impact or load acting on a central region of the solar cell 100.

The upper and lower protective layers may be made of a generally known material and may be made of polyolefin (PO), ethylene vinyl acetate (EVA), or the like.

Meanwhile, the solar cell module according to the present invention may further include a support portion 140 as shown in FIG. 3.

As shown in FIG. 3, in order to prevent cracks or damage to the solar cell 100 caused by an impact, pressure, or the like acting on each of the solar cells 100 disposed at the upper and lower sides due to a stepped portion between a front surface of the one side solar cell 100 and a rear surface of the other side solar cell 100, which is formed by a thickness of the interconnection ribbon 150 due to a structure in which the interconnection ribbon 150 to be described below is disposed between the solar cells 100 overlapping each other, the support portion 140 supports the other side solar cell 100 disposed at the upper side at an edge of a front surface of the one side solar cell 100 disposed to overlap the other side solar cell 100.

As described in the drawings, the support portion 140 is disposed between the front surface of the one side solar cell 100 and the rear surface of the other side solar cell 100 and supports the rear surface of the solar cell 100 disposed at the upper side with respect to the front surface of the one side solar cell 100 disposed at the lower side.

The support portion 140 may be made of a material having elasticity or flexibility and an insulating property. For example, the support portion 140 may be made of an epoxy, polyethylene (PE), polyimide (PI), polyethylene terephthalate (PET), silicone, or the like. In addition, the support portion 140 may be formed through coating, printing, taping, or the like.

Furthermore, when a thickness of the support portion 140 is equal to the thickness of the interconnection ribbon 150 corresponding to the stepped portion between the upper and lower solar cells 100 to prevent the formation of the stepped portion between the upper solar cell 100 and the lower solar cell 100, it is ideal in terms of cracking or a structure. However, in some cases, the thickness of the support portion 140 may be in a range of 0.2 to 1.5 times a thickness of the step portion between the upper solar cell 100 and the lower solar cell 100, and a maximum width of the support portion may be 2 mm.

On the other hand, as shown in FIGS. 4 to 7, one end of both ends of a front busbar electrode 111 formed on a solar cell 100 of a solar cell module according to the present invention is removed to a certain length from an edge of the solar cell 100. Then, a pair of branch busbar electrodes 115 are formed on a front surface of the solar cell 100 so as to be branched and extended by a certain length to the edge of the solar cell 100 from one end of the front busbar electrode 111 which is removed to the certain length.

Referring to FIGS. 4 to 7, the branch busbar electrodes 115 connect a finger electrode 101 to the front busbar electrode 111, wherein the finger electrode 101 is disposed in a region in which the front busbar electrode 111 is not present. In addition, each of the branch busbar electrodes 115 extends to be branched from the end of the front busbar electrode 111 to the edge of the solar cell 100 such that the interconnection ribbon 150 is mounted on the front surface of the solar cell 100. Each of the branch busbar electrodes 115 extends from the end of the front busbar electrode 111 to a finger electrode 101 disposed at an outermost side.

The branch busbar electrodes 115 extend to be branched into two from the end of the front busbar electrode 111 to a position at which the outermost finger electrode 101 is present and which ranges from 0.5 mm to 1 mm away from the edge of the solar cell 100. A spacing interval between the branch busbar electrodes 115 may be in a range of one to three times a width of the interconnection ribbon 150.

For example, the spacing interval between the branch busbar electrodes 115 may be 1.4 mm, a width thereof may be in a range of 0.1 to 0.7 times a width of the front busbar electrode 111, and a length thereof may be in a range of 1 mm to 5 mm.

As shown in the drawings, the branch busbar electrode 115 may be formed in a square shape bent at a right angle from the end of the front busbar electrode 111. Alternatively, of course, the branch busbar electrode 115 may be formed in a gentle curve shape and may be formed in various shapes.

In addition, when the solar cell 100 overlaps a front surface of the solar cell 100 disposed at a lower side, in order to reduce a stepped portion and stress or tension between the solar cells 100 when the rear busbar electrode is coupled to the interconnection ribbon 150, the rear busbar electrode may be formed in a region which is spaced a distance of 0.5 mm to 30 mm from the edge of the solar cell 100.

Figure 4:
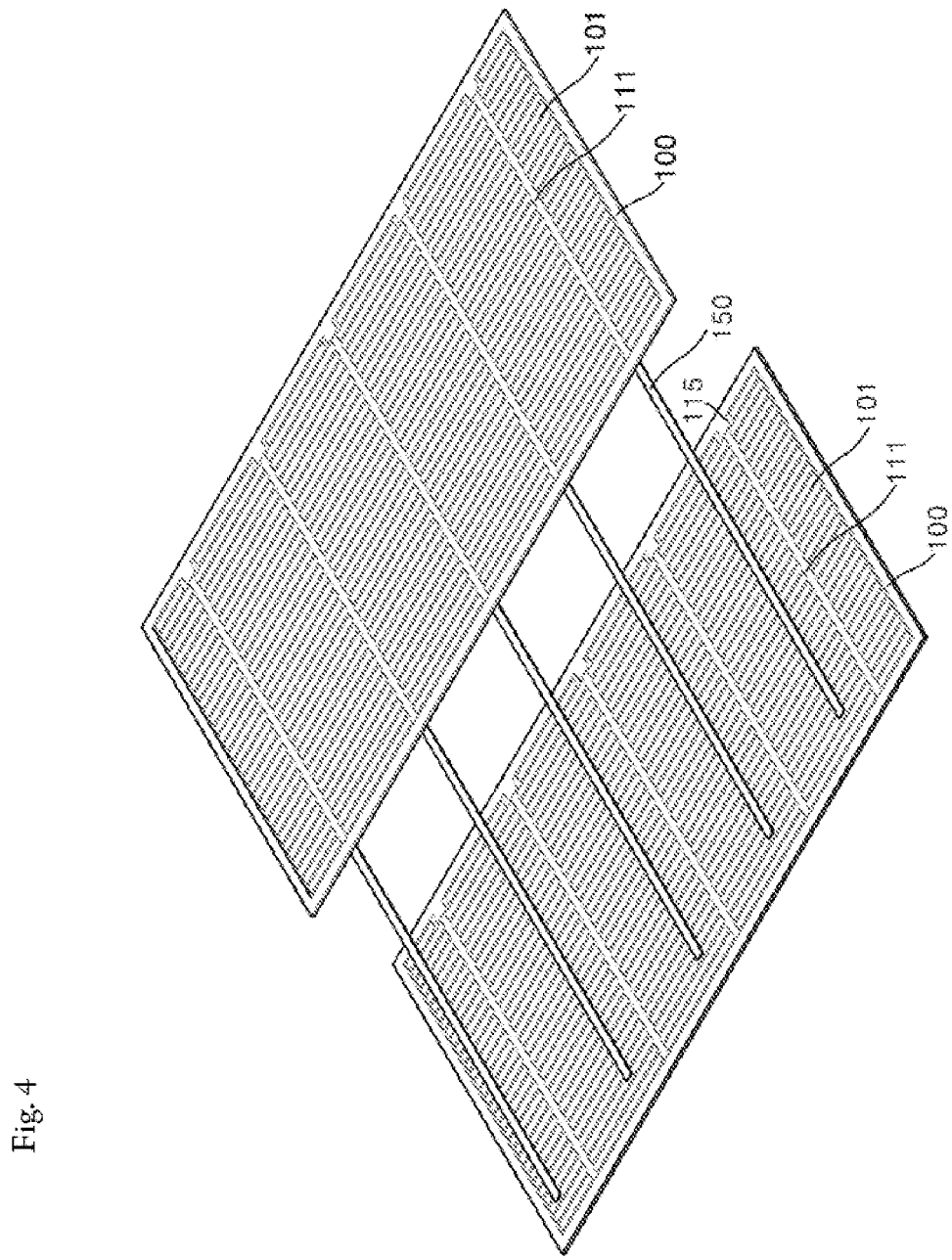
FIG. 4 is an exploded perspective view illustrating a solar cell module according to another embodiment of the present invention.
Figure 5:
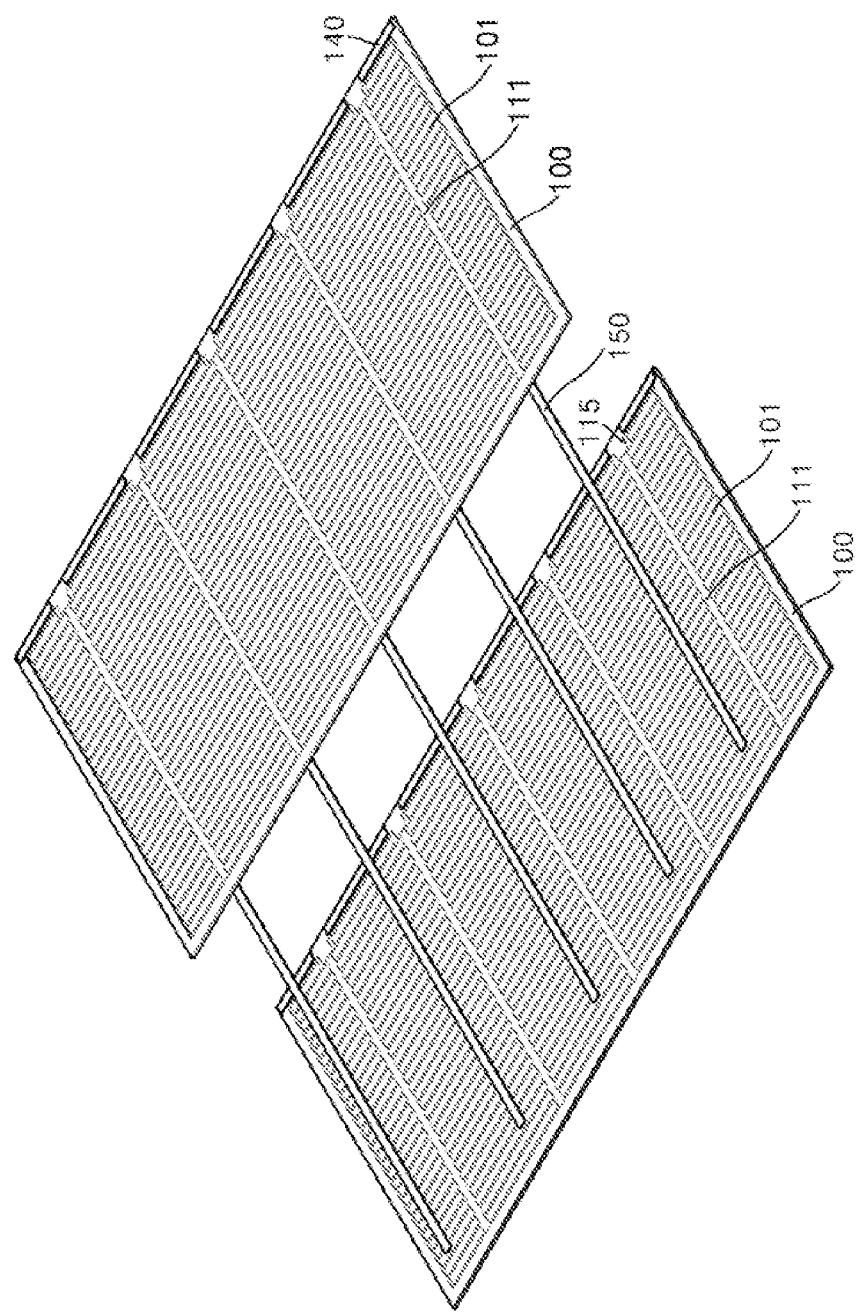
FIG. 5 is an exploded perspective view illustrating the solar cell module further including a support portion.
Figure 6:
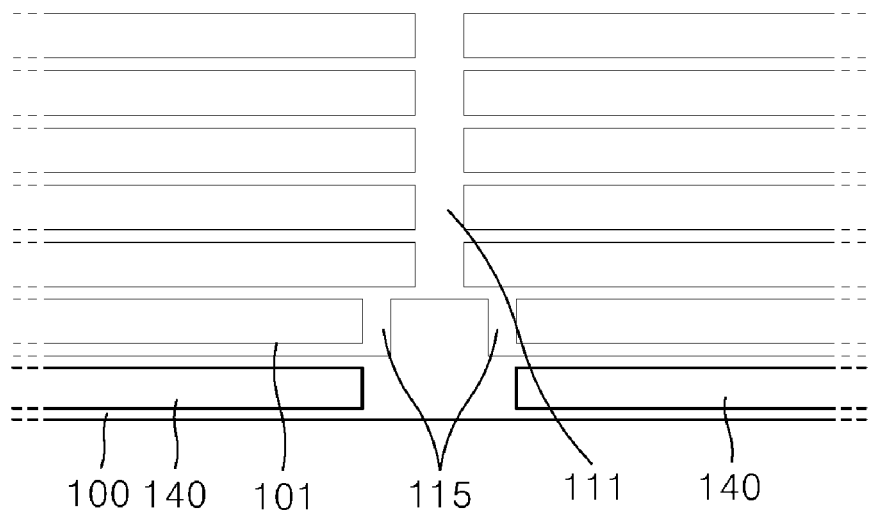
FIG. 6 is a front view illustrating a structure in which a branch busbar electrode is formed on a surface of a solar cell of FIGS. 4 and 5.
Figure 7:
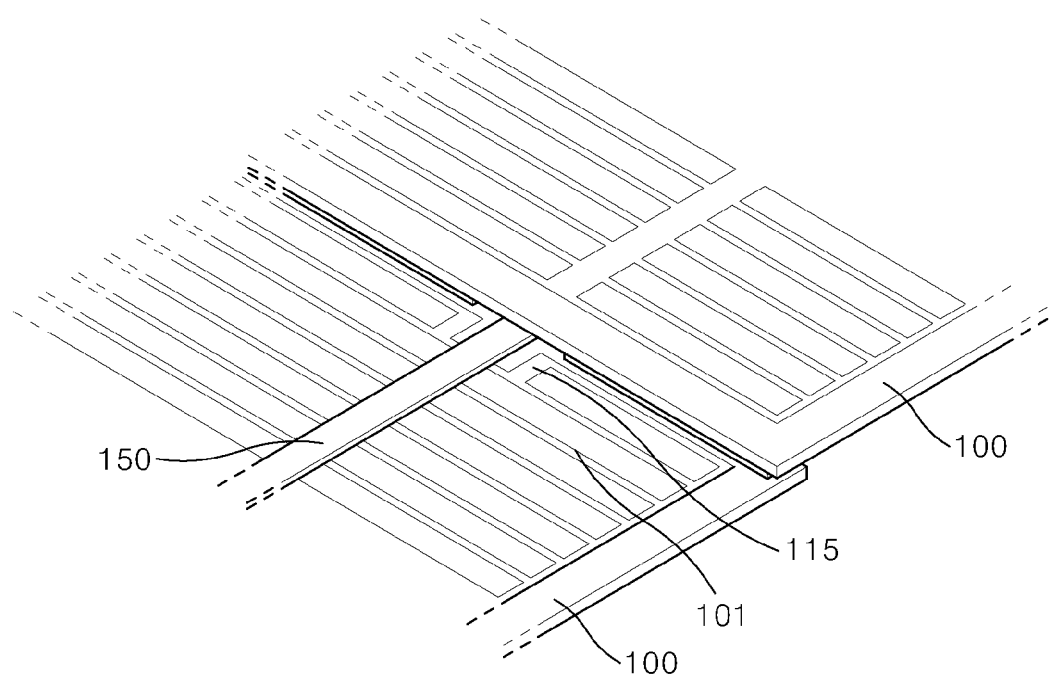
FIG. 7 is a perspective view illustrating a solar cell module according to a second embodiment of the present invention.

In the solar cell module according to the present invention, as shown in FIG. 4, a support portion 140 may also be omitted, and as shown in FIG. 5, the support portion 140 may also be provided.

In a solar cell 100 of a solar cell module according to the present invention, a through-hole 106 may be formed to vertically pass though the solar cell 100 such that an interconnection ribbon 150 passes through portions at which the one side solar cell 100 and the other side solar cell 100 overlap each other.

Figure 8:
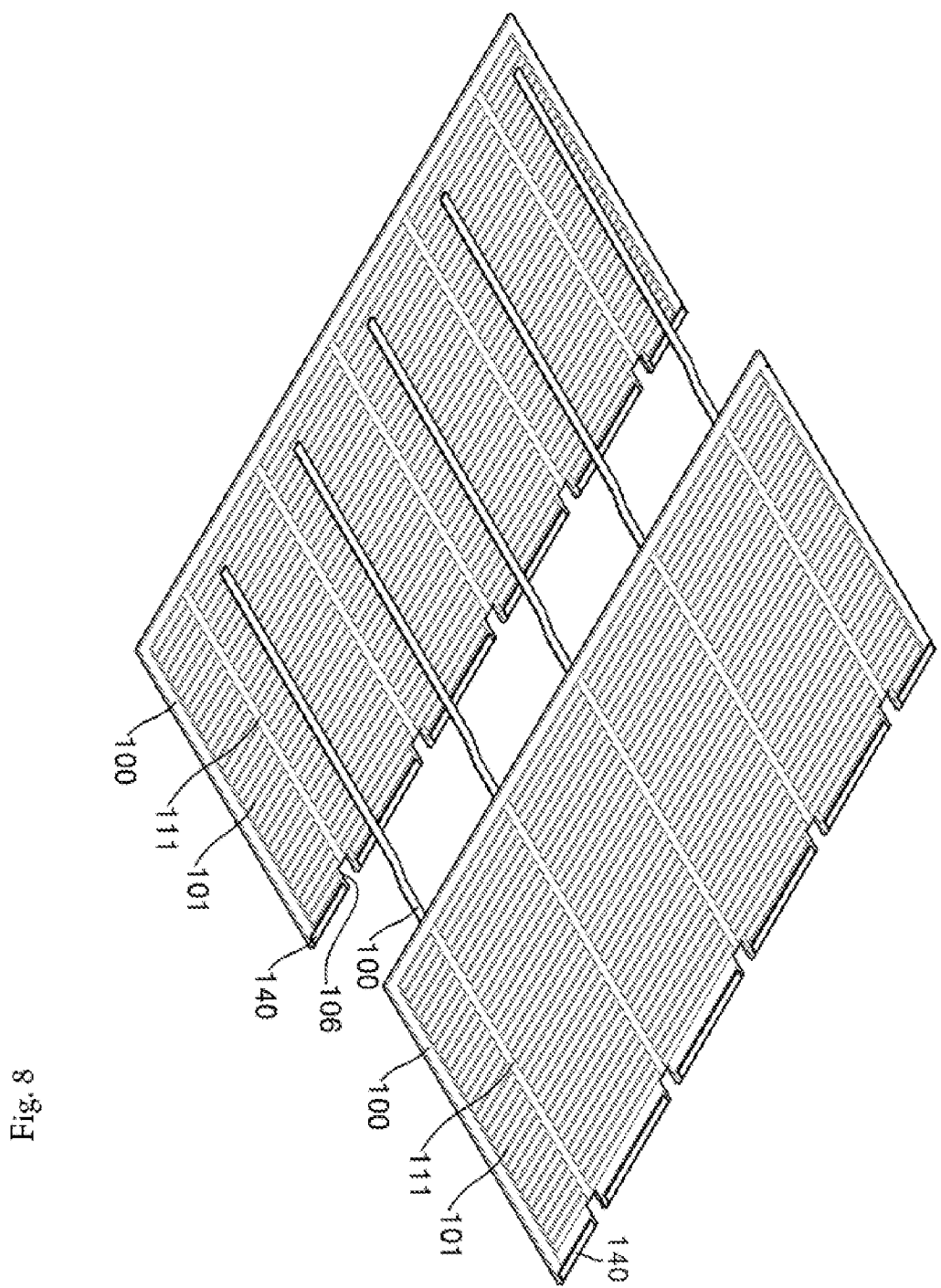
FIG. 8 is a perspective view illustrating a structure in which through-holes are formed in solar cells of a solar cell module according to another embodiment of the present invention.
Figure 9:
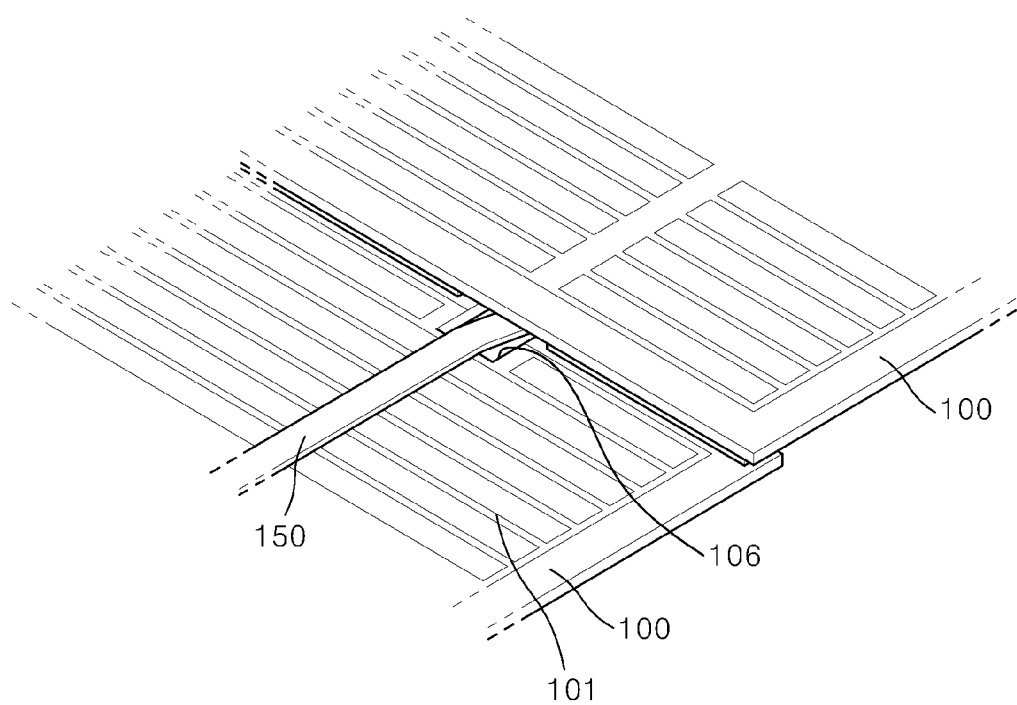
FIG. 9 is a cross-sectional view illustrating a state in which the solar cells of FIG. 8 are installed to overlap each other.

Referring to FIGS. 8 and 9, the interconnection ribbon 150 disposed in contact with an upper portion of a front busbar electrode 111 of the one side solar cell 100 may be installed to pass through the through-hole 106 formed in an edge of the solar cell 100 and be in contact with a rear busbar electrode of the other side solar cell 100 disposed at an upper side, thereby further reducing a stepped portion between the one side solar cell 100 and the other side solar cell 100.

Meanwhile, of course, unlike the through-hole 106 shown in the drawings, the edge of the solar cell 100 may not be completely removed from the solar cell 100 and may be formed in the form of an insertion groove recessed downward by a certain depth such that only a certain portion of the interconnection ribbon 150 is inserted into the solar cell 100. In this case, a depth of the insertion groove may be at least 0.2 times a thickness of the interconnection ribbon 150.

The above-described through-hole 106 or insertion groove formed in the solar cell 100 may be formed by completely or partially removing a wafer or a substrate of the solar cell 100 corresponding to a region between the branch busbar electrodes 115 using a mechanical or chemical etching method. A removal range may be within a range of a spacing interval and height between the branch busbar electrodes 115.

The through-hole 106 or insertion groove may be formed in a quadrangular shape as shown in the drawings or be formed in a semicircular shape, an arcuate shape, a trapezoidal shape, or a triangular shape.

Figure 23:
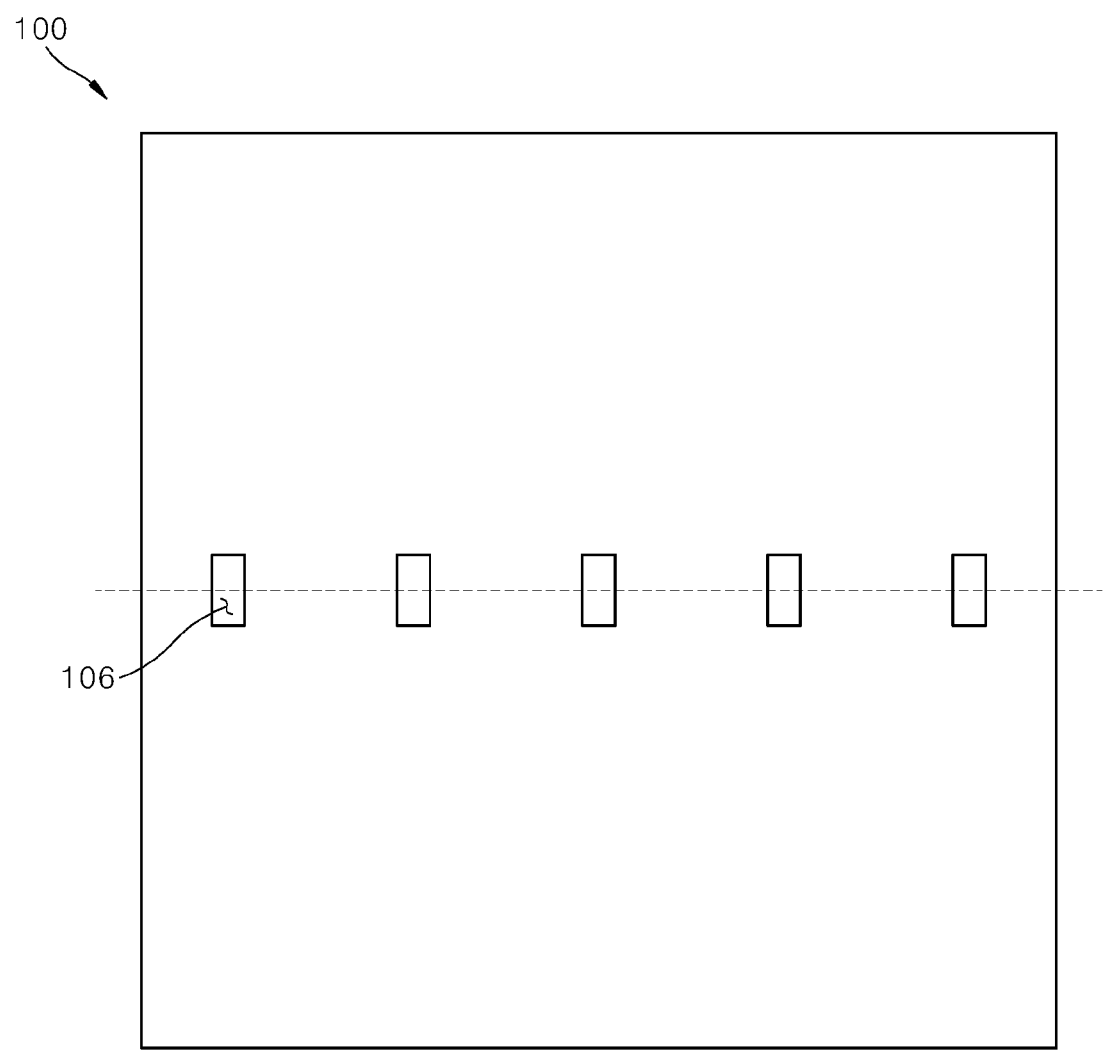
FIG. 23 is a plan view illustrating a through-hole formed in a solar cell according to an embodiment.
Figure 24:
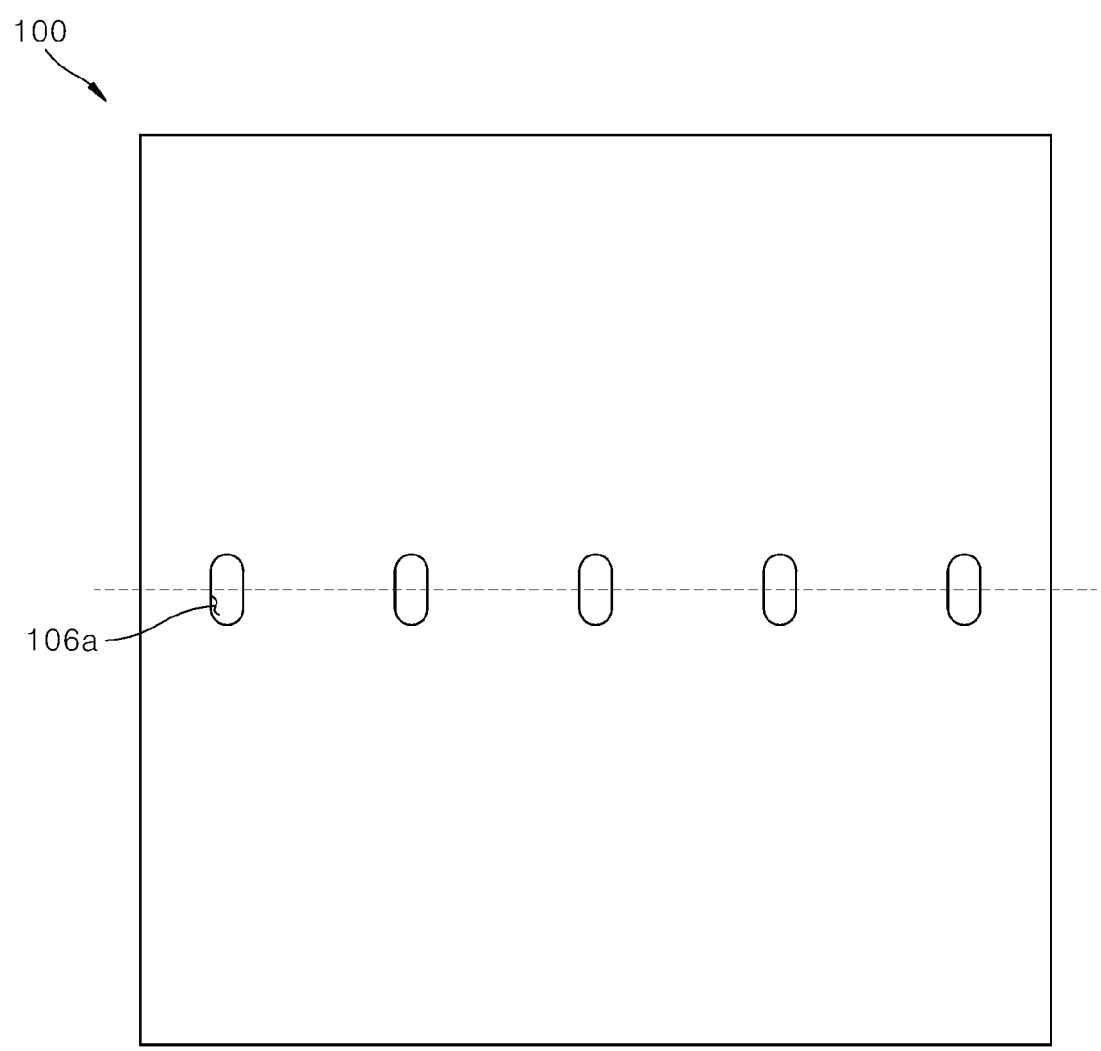
FIG. 24 is a plan view illustrating a through-hole formed in a solar cell according to another embodiment.

In an example, when a through-hole or insertion groove is formed in a quadrangular shape, as shown in FIG. 23, a hole 106 or a groove having a rectangular shape, which is longer in a vertical direction, may be formed in a central portion of the substrate of the solar cell 100. Then, the substrate of the solar cell 100 may be divided to form the hole 106 or the groove so as to be divided into two in the vertical direction. In another example, when a through-hole or insertion groove is formed in a semicircular shape or an arcuate shape, as shown in FIG. 24, a hole 106a or a groove having an elliptical shape, which is longer in a vertical direction, may be formed in a central portion of the substrate of the solar cell 100. Then, the substrate of the solar cell 100 may be divided to form the hole 106a or the groove so as to be divided into two in the vertical direction.

Figure 25:
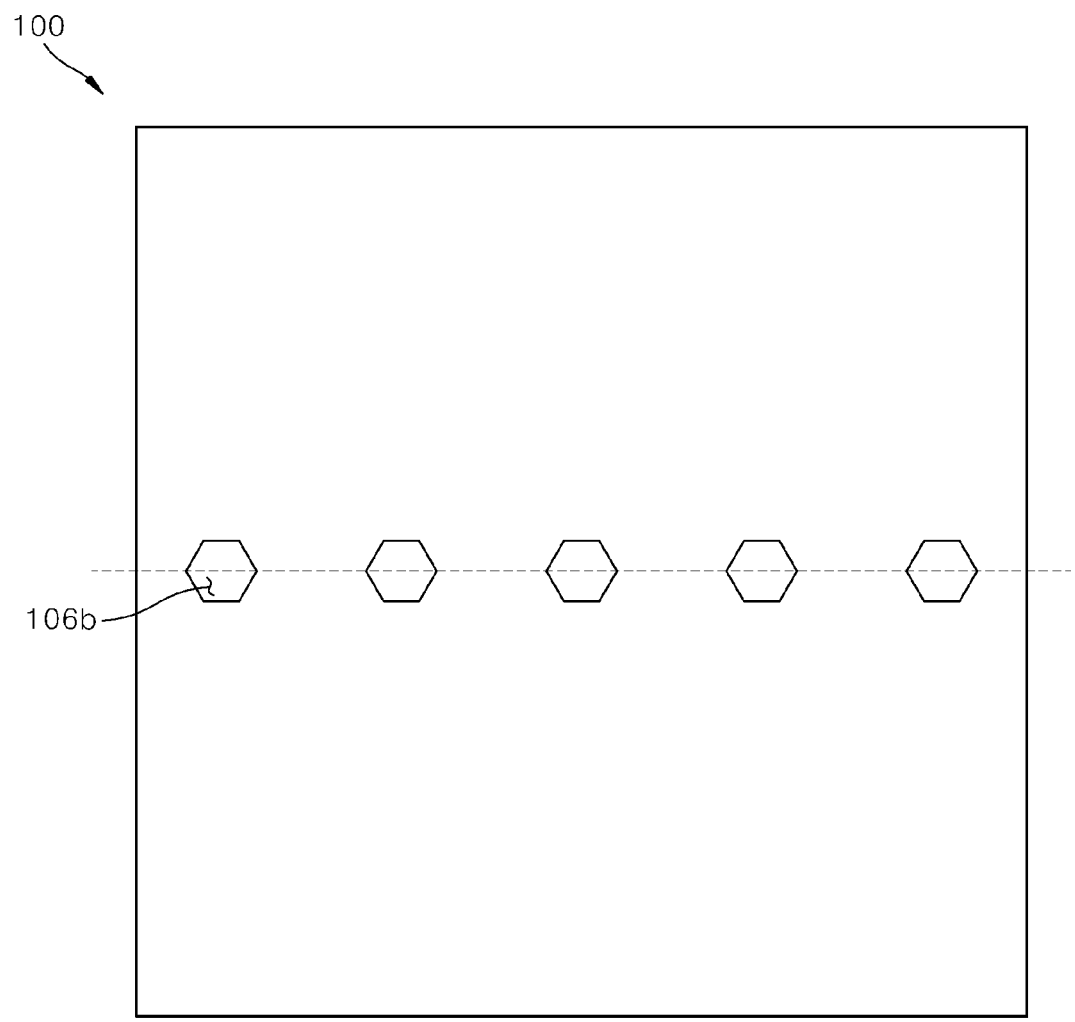
FIG. 25 is a plan view illustrating a through-hole formed in a solar cell according to still another embodiment.

In still another example, when a through-hole or insertion groove is formed in a trapezoidal shape, as shown in FIG. 25, a hole 106b or a groove having a hexagonal shape may be formed in a central portion of the substrate of the solar cell 100. Then, the substrate of the solar cell 100 may be divided to form the hole 106b or the groove so as to be divided into two in a vertical direction.

Figure 26:
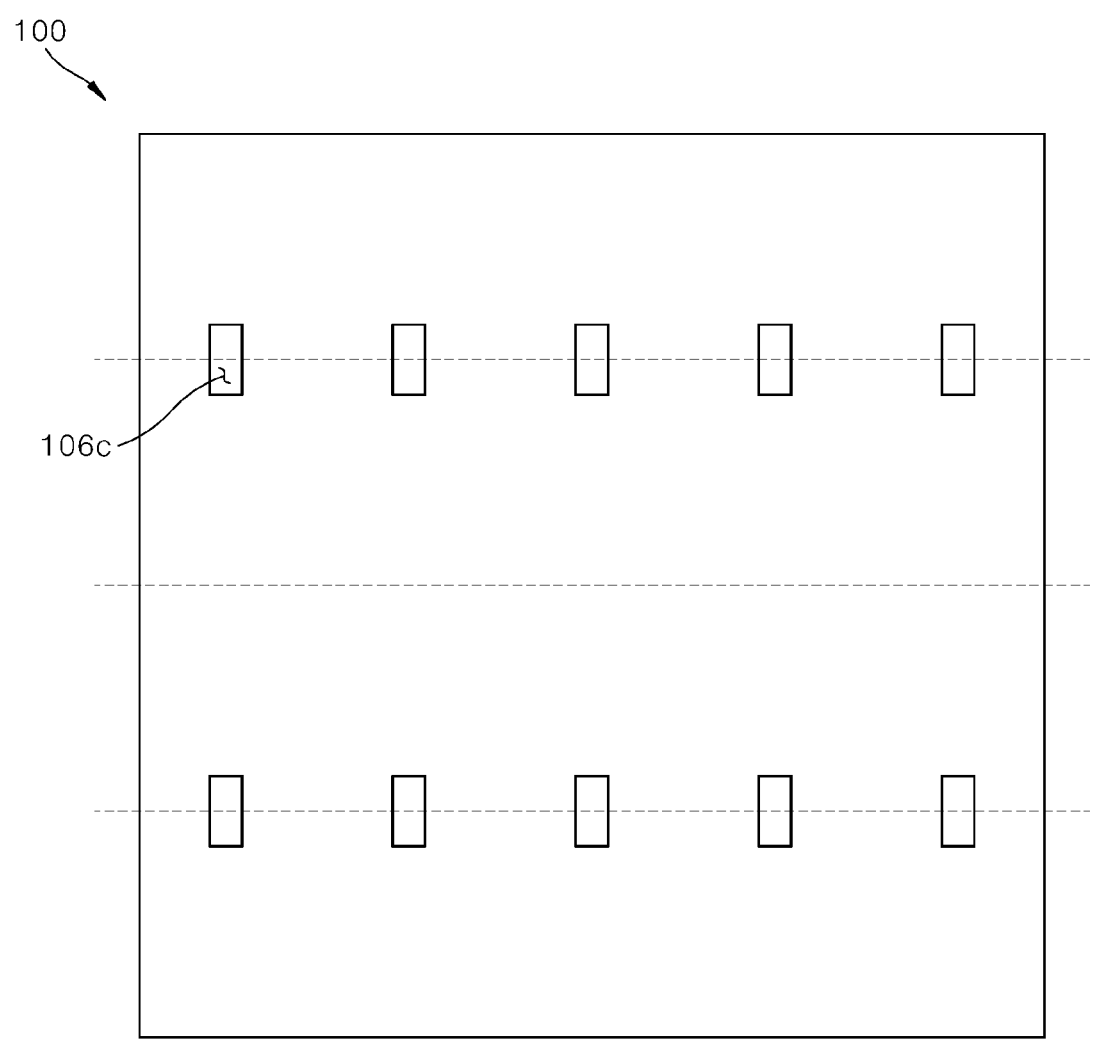
FIG. 26 is a plan view illustrating a through-hole formed in a solar cell according to yet another embodiment.

In addition, as shown in FIG. 26, through-holes 106c or insert grooves may be formed in an upper central portion and a lower central portion with respect to a center of a vertical length of the wafer or the solar cell 100, and the solar cell 100 may be divided into two with respect to the center of the vertical length. Then, the divided solar cell 100 may be divided again to form the through-hole 106c or insertion groove formed in each of the divided solar cells 100 so as to be divided into two.

Figure 27:
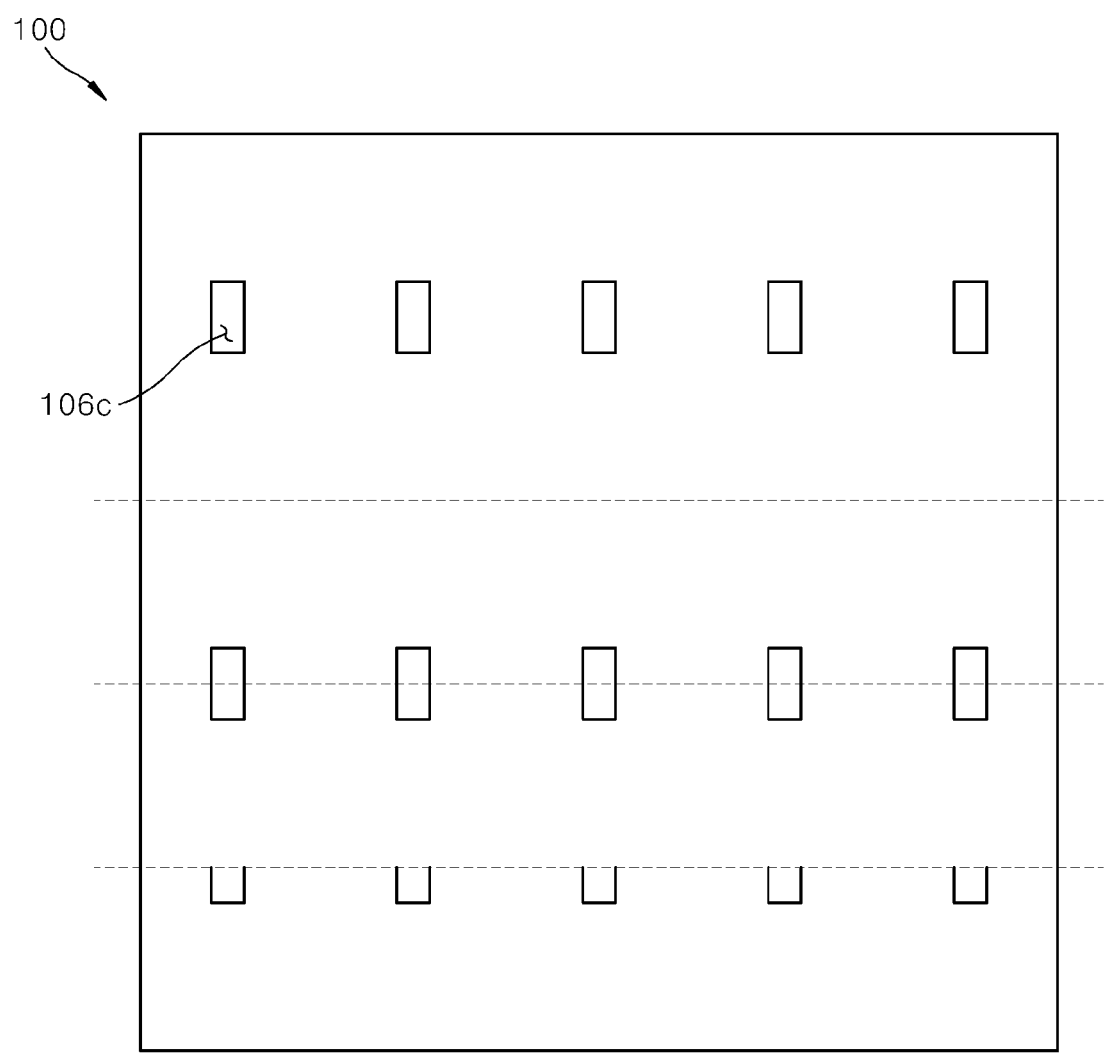
FIG. 27 is a plan view illustrating a through-hole formed in a solar cell according to yet another embodiment.

When the solar cell 100 is divided into an even number, methods shown in FIGS. 23 to 26 may be applied. However, when the solar cell 100 is divided into an odd number, as shown in FIG. 27, one side through-hole or insertion groove may be formed to have a size that is a half of a size of the other side through-hole or insertion groove. In addition, regardless of the number of the solar cells 100 to be divided, a through-hole or insertion groove may also be formed in each of the solar cells 100 to be divided.

As shown in FIGS. 8, 9, and 23 to 27, when the through-holes 106, 106a, 106b, and 106c or the insertion grooves are formed in the solar cell 100, the interconnection ribbon 150 may completely pass through the edge of the solar cell 100 or a certain portion of the interconnection ribbon 150 may be inserted into the edge of the solar cell 100, thereby reducing a stepped portion between the front surface of the solar cell 100 disposed at the lower side and the rear surface of the solar cell 100b disposed at the upper side, which are disposed to overlap each other. Accordingly, as compared with a structure of a conventional solar cell in which the front busbar electrode 111 is formed but the through-holes 106, 106a, 106b, and 106c, or the insertion grooves are not formed, the stepped portion may be further reduced by a depth of the through-holes 106, 106a, 106b, and 106c, or the insertion grooves.

The through-holes 106, 106a, 106b, and 106c or the insertion grooves shown in FIGS. 23 to 27 may be formed in the wafer and may also be formed in the solar cell 100.

Meanwhile, in order to form a structure in which the solar cells 100 partially overlap each other in the extending direction of the front busbar electrode, the solar cell module of the present invention may have a structure in which single crystal or polycrystal solar cells (hereinafter, referred to as "original solar cells") are installed such that one solar cell overlaps another solar cell. Alternatively, the solar cell module may have a structure in which a plurality of solar cells 100 divided from a solar cell having an existing size are stacked.

In an example, the solar cell 100 may be formed by dividing a polycrystal solar cell in two in a direction orthogonal to an extending direction of a front busbar electrode 111 with respect to a center in a longitudinal direction of the polycrystal solar cell having a typical size.

Figure 10:
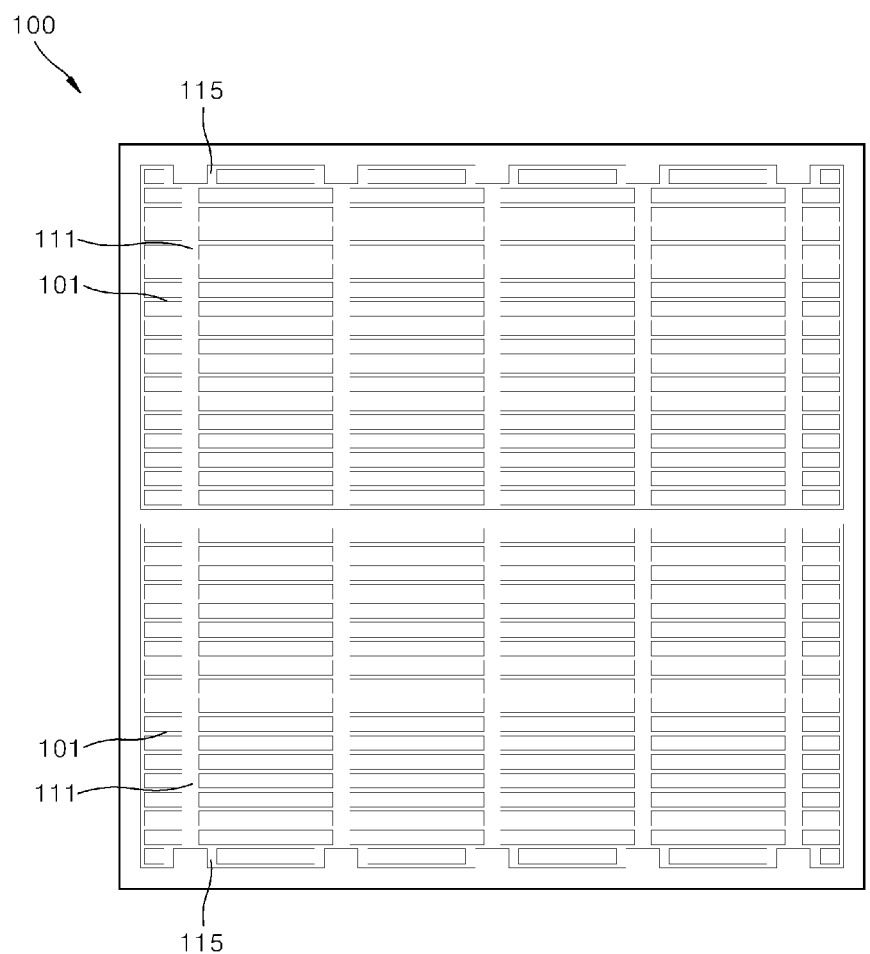
FIG. 10 is a plan view illustrating an example of a structure of a front busbar electrode formed on a front surface of a solar cell applied to a solar cell module of the present invention.

To this end, as shown in FIG. 10, two independent front electrode patterns (finger electrode 101 and front busbar electrode) are formed on a front surface of an original solar cell 100 in a vertical direction. At least one end of both ends of the front busbar electrode 111 is partially formed, and each branch busbar electrode 115 is formed to be branched and extended to an edge of the solar cell 100 from an end of the front busbar electrode 111.

Figure 11:
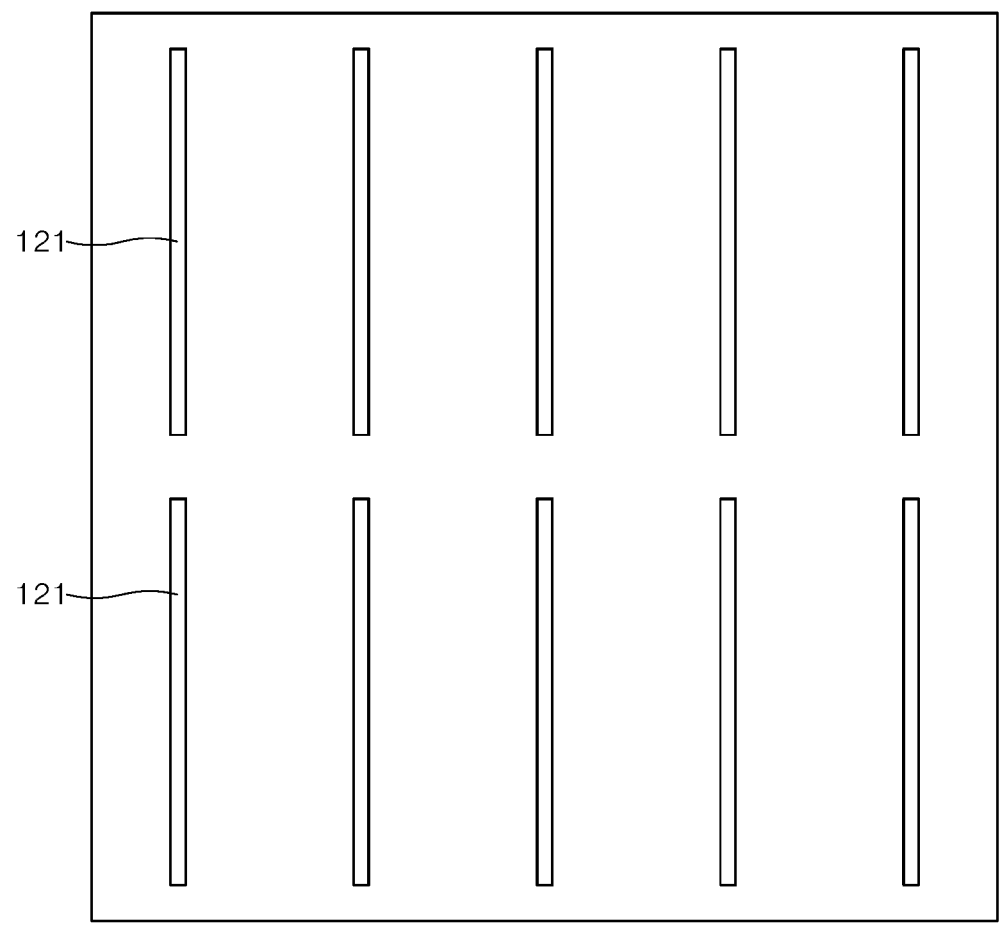
FIG. 11 is a plan view illustrating an example of a structure of a rear busbar electrode formed on a rear surface of the solar cell shown in FIG. 10.

As shown in FIG. 11, a rear busbar electrode 121 is formed at a position corresponding to the front busbar electrode 111 on a rear surface of the original solar cell 100 in a direction parallel to the extending direction of the front busbar electrode 111. In this case, the rear busbar electrode 121 is also intermittently formed as a pattern of the front busbar electrode 111.

As described above, the original solar cell 100 may be divided into two, and then, among the divided solar cells, an edge of a solar cell 100, in which the branch busbar electrode 115 is not formed, may be disposed to overlap an upper portion of an edge of a solar cell 100, in which the branch busbar electrode 115 is formed, thereby implementing a solar cell module according to the present invention.

Figure 12:
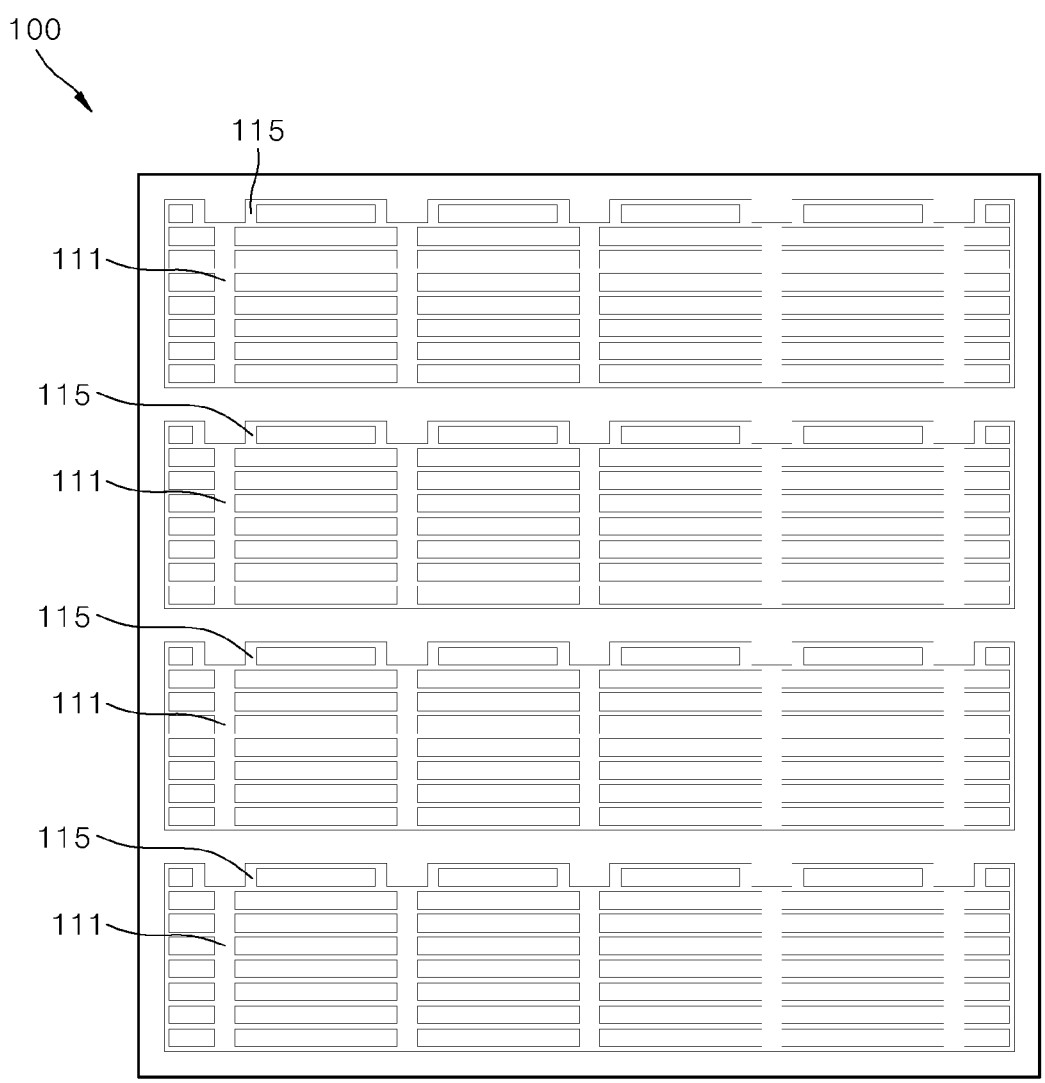
FIG. 12 is a plan view illustrating another example of a structure of a front busbar electrode formed on the front surface of the solar cell applied to the solar cell module of the present invention.
Figure 13:
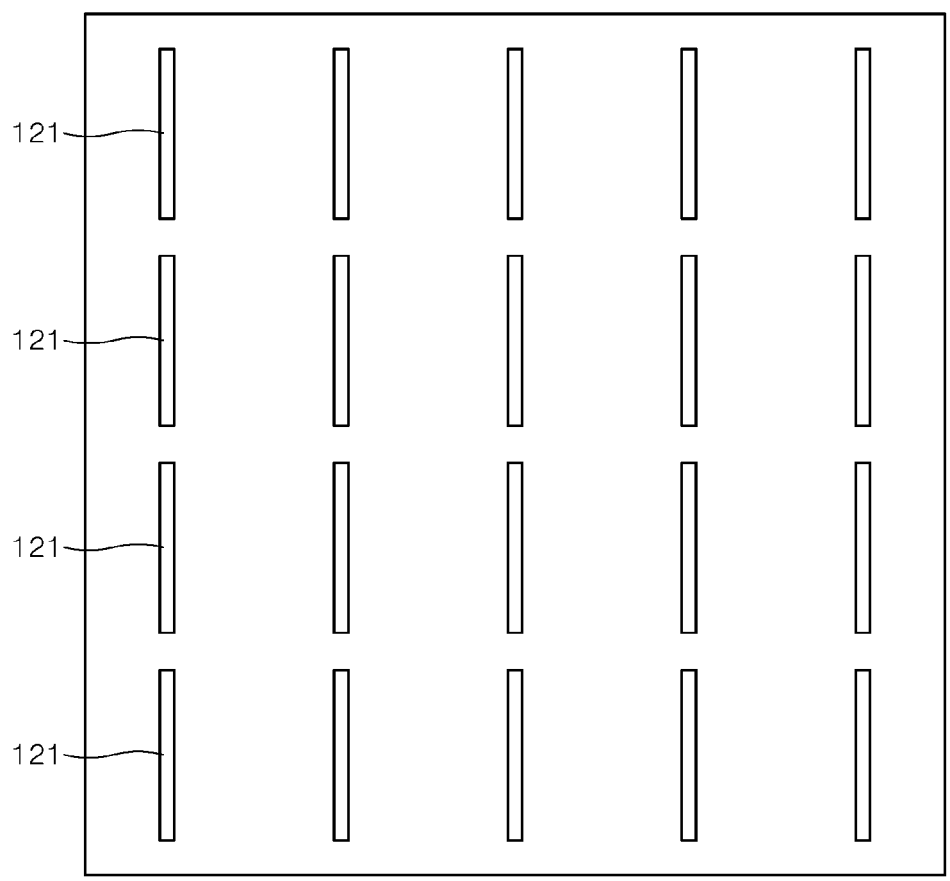
FIG. 13 is a plan view illustrating another example of a structure of a rear busbar electrode formed on the rear surface of the solar cell shown in FIG. 12.

On the other hand, in an illustrated example, a structure in which the original solar cell 100 is divided into two is applied. However, as shown in FIGS. 12 and 13, four electrode patterns may divide an independently formed solar cell 100 into four solar cells 100 having the same width, and then, an edge of a solar cell 100, in which the branch busbar electrode 115 is not formed, may be disposed to overlap an edge of a solar cell 100, in which the branch busbar electrode 115 is formed, thereby implementing a solar cell module according to the present invention.

In this case, the front busbar electrode 111 is discontinuously formed on a front surface of the solar cell 100 so as to be divided into four in a longitudinal direction, and the branch busbar electrode 115 is formed on at least one end of both ends of the rear busbar electrode 111. Like the front busbar electrode 111, the rear busbar electrode 121 is also discontinuously formed on a rear surface of the solar cell 100 so as to be divided into four in the longitudinal direction.

As shown in the drawings, according to a structure in which a conventional original solar cell manufactured to have a typical size is divided into a plurality of solar cells 100 and the divided solar cells 100 overlap each other and are connected through the interconnection ribbon 150, an output may be improved through an occupancy ratio of the solar cells 100, which is higher than that of a conventional solar cell module, and cracks or the like may be prevented by reducing a stepped portion between an upper solar cell 100 and a lower solar cell 100 through a support portion 140, a through-hole 106, an insertion groove, and the like.

Figure 14:
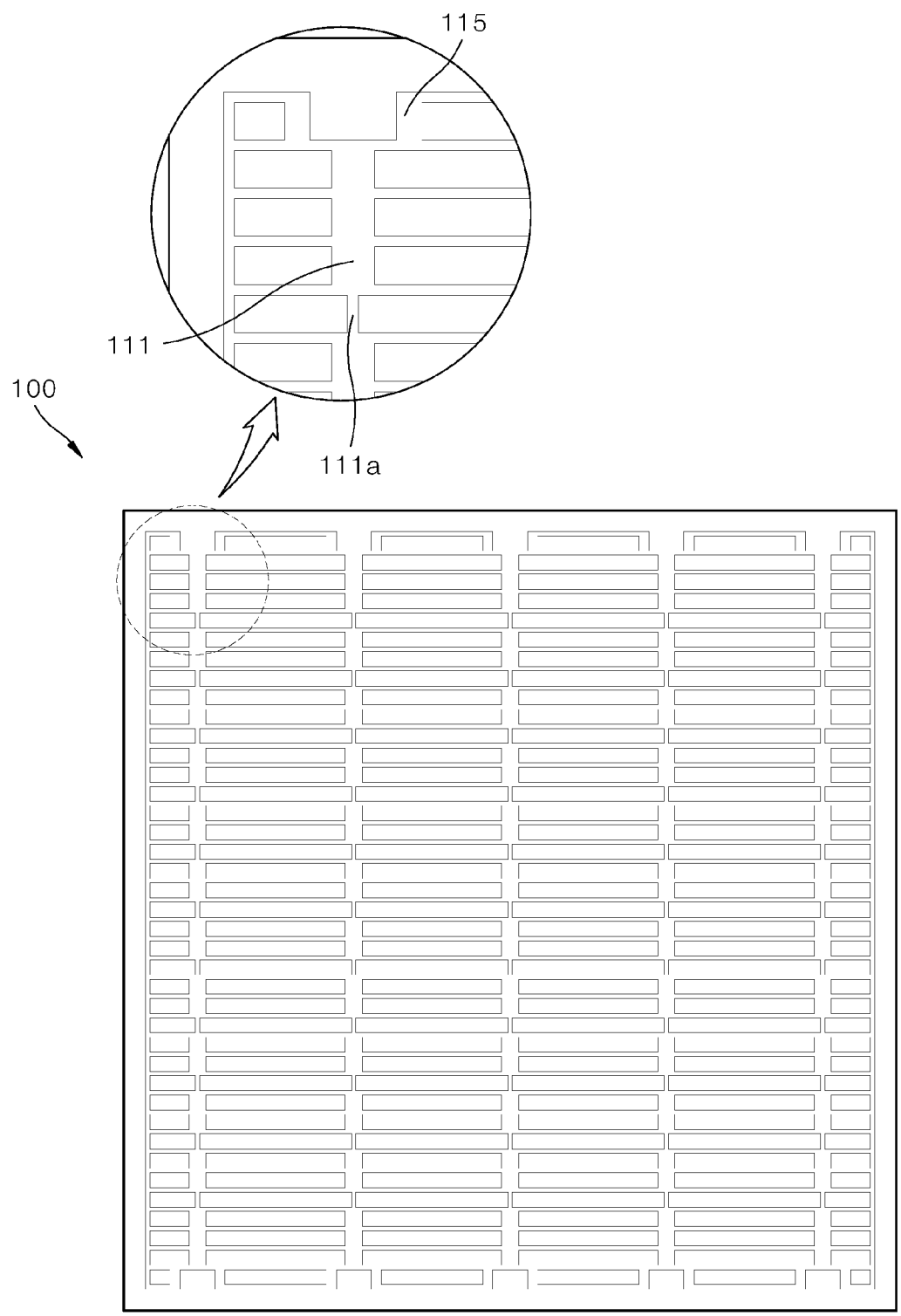
FIG. 14 is a plan view illustrating still another example of a structure of a front busbar electrode formed on the front surface of the solar cell applied to the solar cell module of the present invention.

Meanwhile, a front busbar electrode 111 is continuously formed on a solar cell 100 used in the solar cell module according to the present invention. As shown in FIG. 14, a width of the front busbar electrode 111 may be decreased in a partial region 111a. A plurality of partial regions 111a in which the width is decreased may be formed at set intervals in a longitudinal direction of the front busbar electrode 111. In addition, in the case of the front busbar electrode 111 of which the width is decreased in the partial region 111a, the plurality of partial regions 111a may be formed in parallel within the width of the front busbar electrode 111 before the width is decreased.

Figure 15:
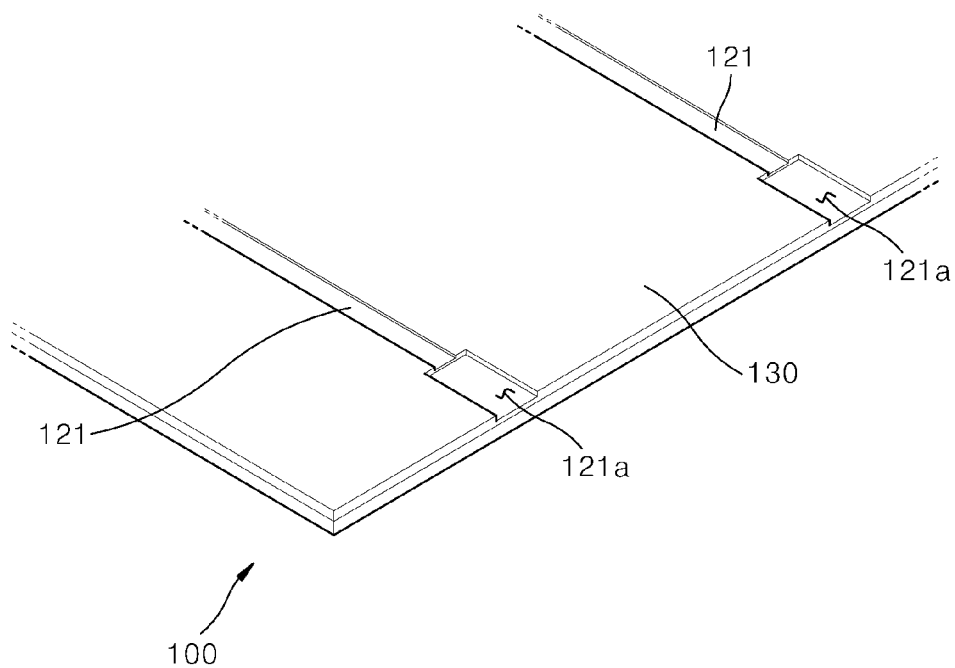
FIG. 15 is an enlarged perspective view illustrating a rear surface of a solar cell applied to a solar cell module according to another embodiment of the present invention.
Figure 18:
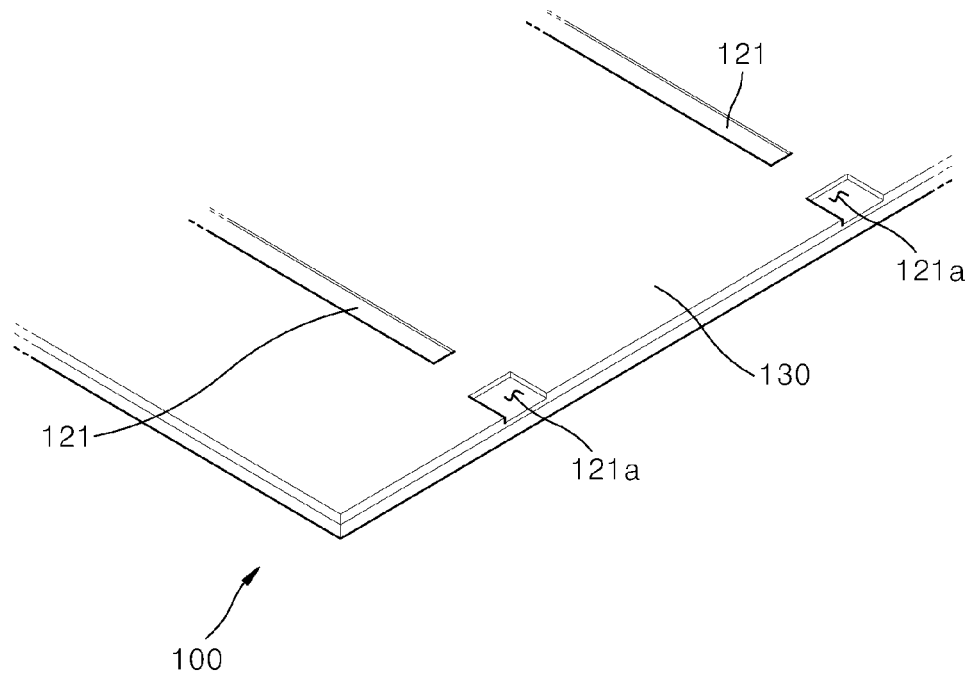
FIG. 18 is an enlarged perspective view illustrating a rear surface of a solar cell applied to a solar cell module according to another embodiment of the present invention.

As shown in FIGS. 15 and 18, the solar cell module according to the present invention may have a structure in which a rear busbar electrode 121 of a solar cell 100 is removed or is not formed to a certain length from an edge of the solar cell 100 and an aluminum layer 130 thicker than the rear busbar electrode 121 is formed on a rear surface of the solar cell 100 excluding the rear busbar electrode 121.

In a certain region between an end of the rear busbar electrode 121 and an edge of the solar cell 100, the aluminum layer 130 may be formed to have a thickness less than or equal to a thickness of the rear busbar electrode 121, or an insertion portion 121a may be formed by completely removing the aluminum layer 130.

Figure 16:
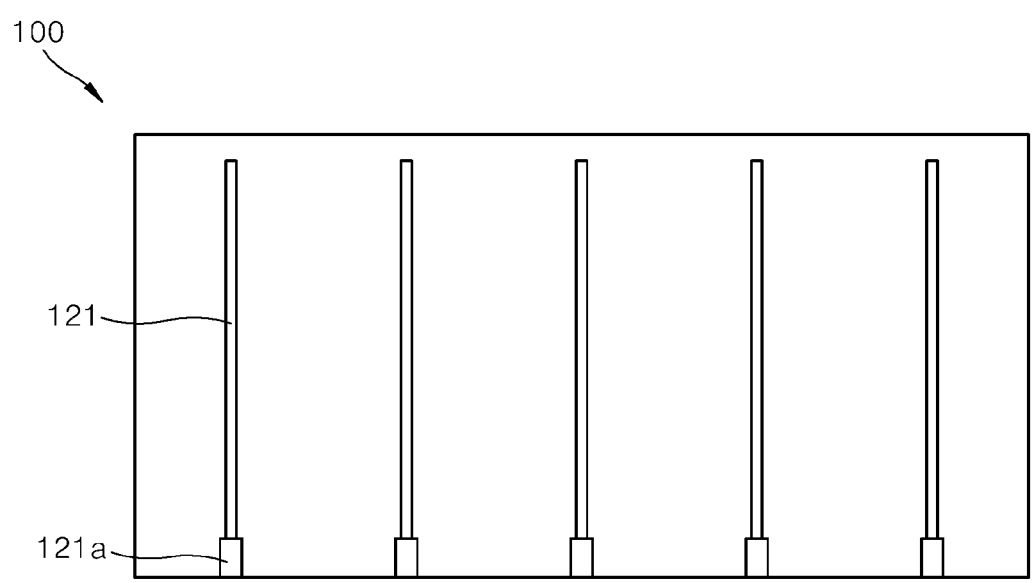
FIG. 16 is a plan view illustrating the rear surface of the solar cell shown in FIG. 15.

In an example, as shown in FIGS. 15 and 16, the aluminum layer 130 may have the insertion portion 121a which is formed to have the thickness less than or equal to the thickness of the rear busbar electrode 121 in the certain region between the end of the rear busbar electrode 121 and an edge of a rear surface of the solar cell 100. Alternatively, an insertion portion (not shown) may be formed in a form in which the aluminum layer 130 is completely removed such that a surface of the solar cell 100 is exposed to the outside.

Figure 17:
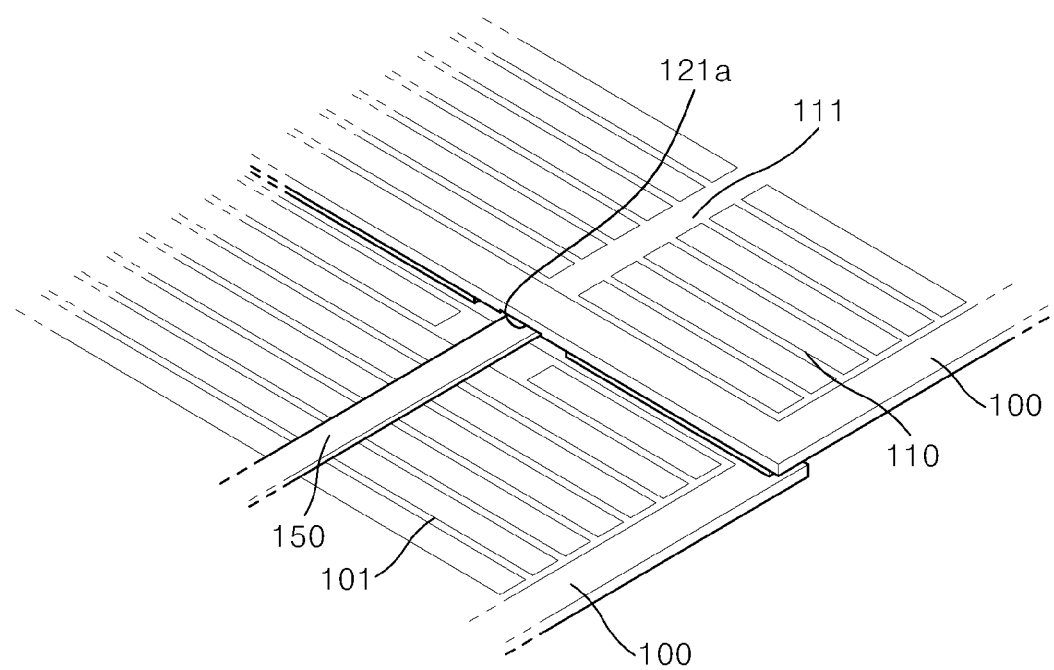
FIG. 17 is a perspective view illustrating an installation structure of the solar cell shown in FIGS. 15 and 16.

As shown in FIG. 17, when the solar cells 100 are disposed to overlap each other, an interconnection ribbon 150 may be inserted into the rear surface to a certain depth, thereby reducing a stepped portion between the solar cell 100 disposed at a lower side and the solar cell 100 disposed at an upper side which is caused by a thickness of the interconnection ribbons 150.

In another example, as shown in FIG. 18, an aluminum layer 130 may have an insertion portion 121a which extends from an edge of a rear surface of a solar cell 100 to a certain region in a direction of a rear busbar electrode 121 so as to be spaced apart from an end of the rear busbar electrode 121 and is formed to have a thickness less than or equal to that of the rear busbar electrode 121. Alternatively, an insertion portion (not shown) may be formed to have a structure in which the whole of the aluminum layer 130 in a corresponding region is removed such that a surface of the solar cell 100 is exposed to the outside. As described above, a width of the insertion portion 121a, which is formed to be less than or equal to the thickness of the rear busbar electrode 121 or is formed by completely removing the aluminum layer 130, corresponds to a width of a front busbar electrode 111 on a front surface of the solar cell 100.

Figure 19:
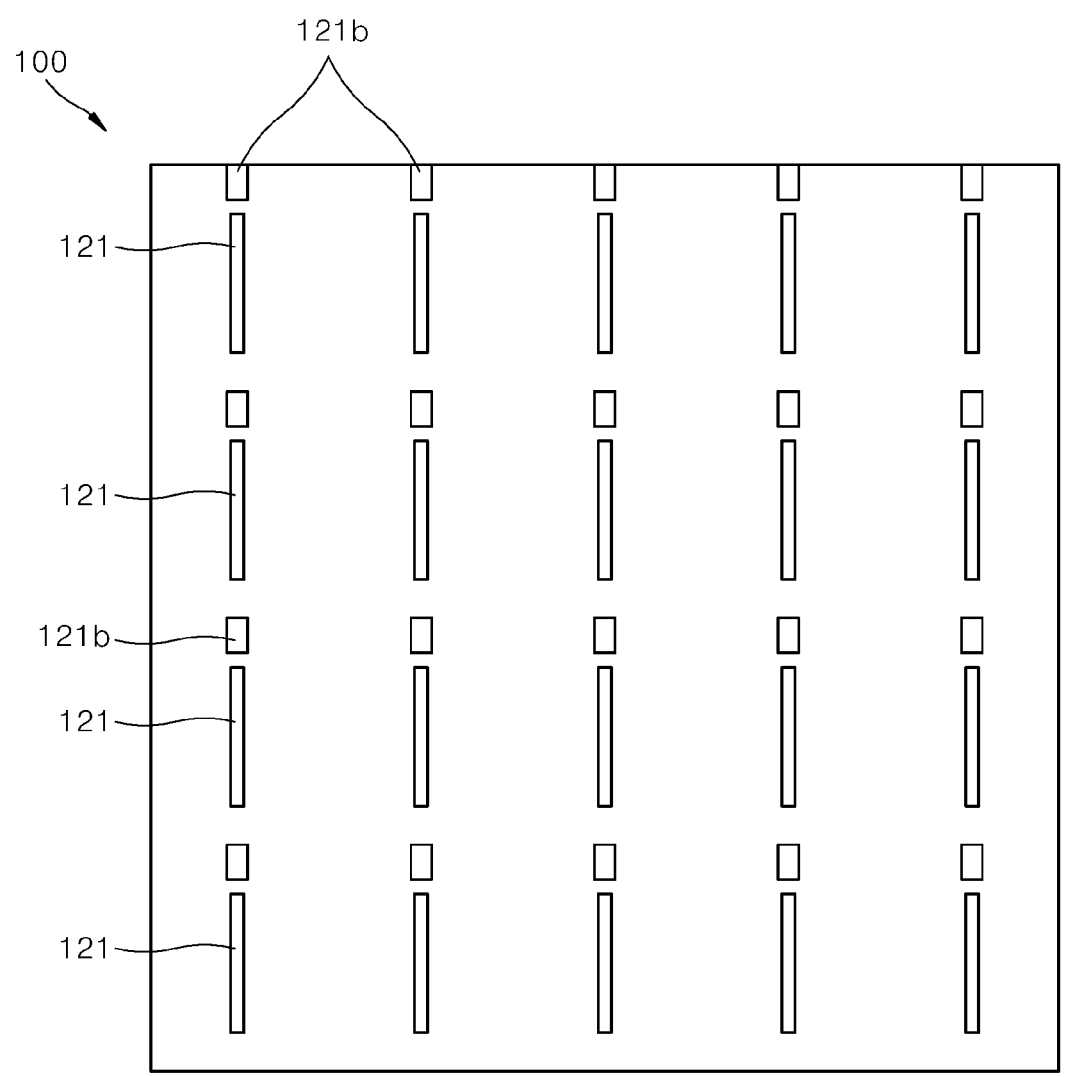
FIG. 19 is a plan view illustrating a rear surface of a solar cell applied to a solar cell module according to another embodiment of the present invention.

Meanwhile, as described with reference to FIGS. 15 to 18, the insertion portion 121a may be formed to have a thickness less than or equal to the thickness of the rear busbar electrode 121 or may be formed to have the structure in which the whole of the aluminum layer 130 formed in the solar cell 100 is removed such that the surface of the solar cell 100 is exposed to the outside. Alternatively, as shown in FIG. 19, a structure of an insertion groove (not shown) may be formed by removing a portion of a solar cell 100 below an aluminum layer 130 as well as the aluminum layer 130 corresponding to a certain region from a point spaced a certain distance apart from a rear busbar electrode 121, or a structure of a through-hole 121b may be formed to pass through the entirety of the solar cell 100 by removing the entirety of the solar cell 100. That is, the insertion portion 121a may be formed by removing a portion or the whole of the solar cell 100 corresponding to a region in which the insertion portion 121a is formed.

Figure 20:
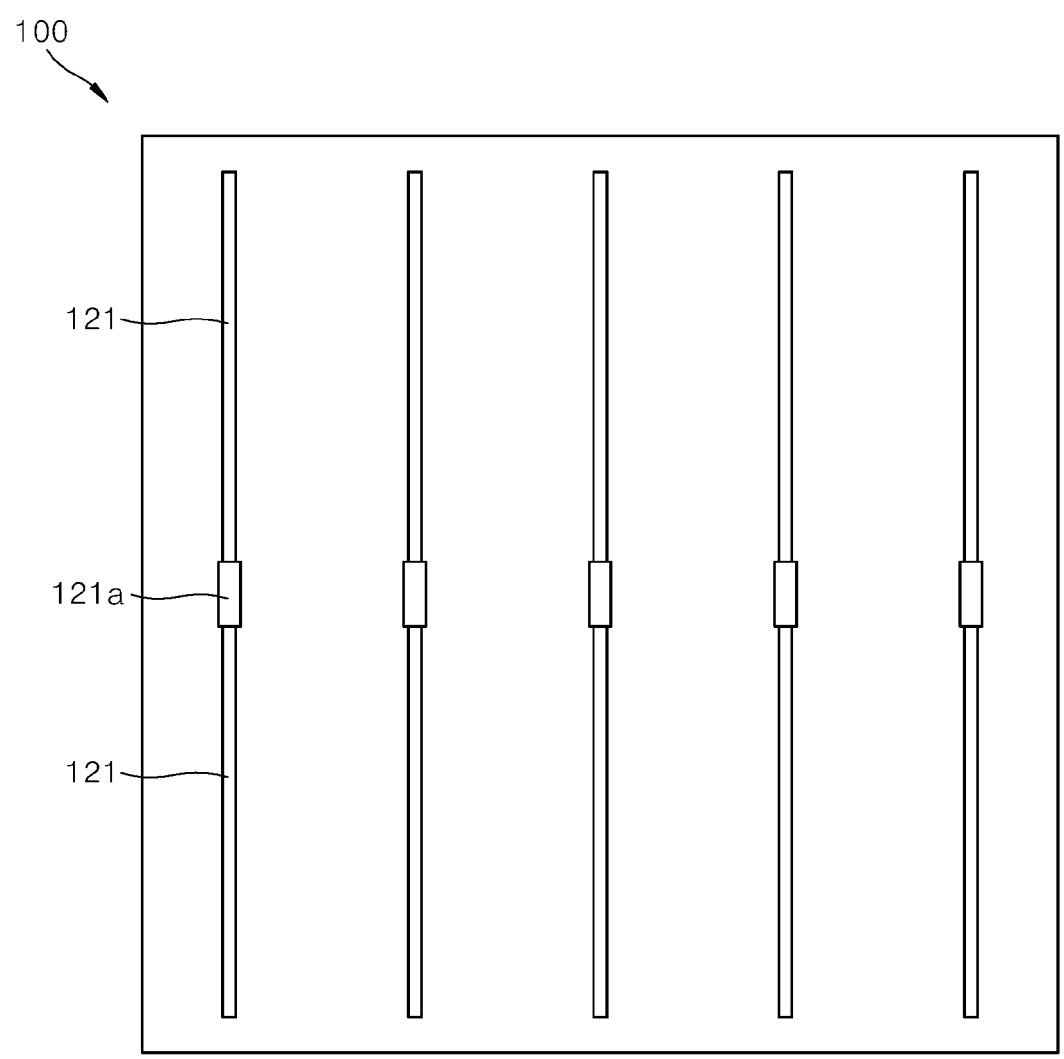
FIG. 20 is a plan view illustrating a rear surface of a solar cell applied to a solar cell module according to another embodiment of the present invention.

In addition, as shown in FIG. 20, an insertion portion 121a of an aluminum layer 143, which is formed to be less than or equal to a thickness of a rear busbar electrode 121 or is formed by removing the aluminum layer 143, may also be formed to be continued from an end of the rear busbar electrode 121 when a solar cell 100 is divided into two. Alternatively, as shown in FIG. 21, an insertion portion 121a may be formed to be spaced apart from each of ends of rear busbar electrodes 121 at a central portion of a solar cell 100.

Figure 22:
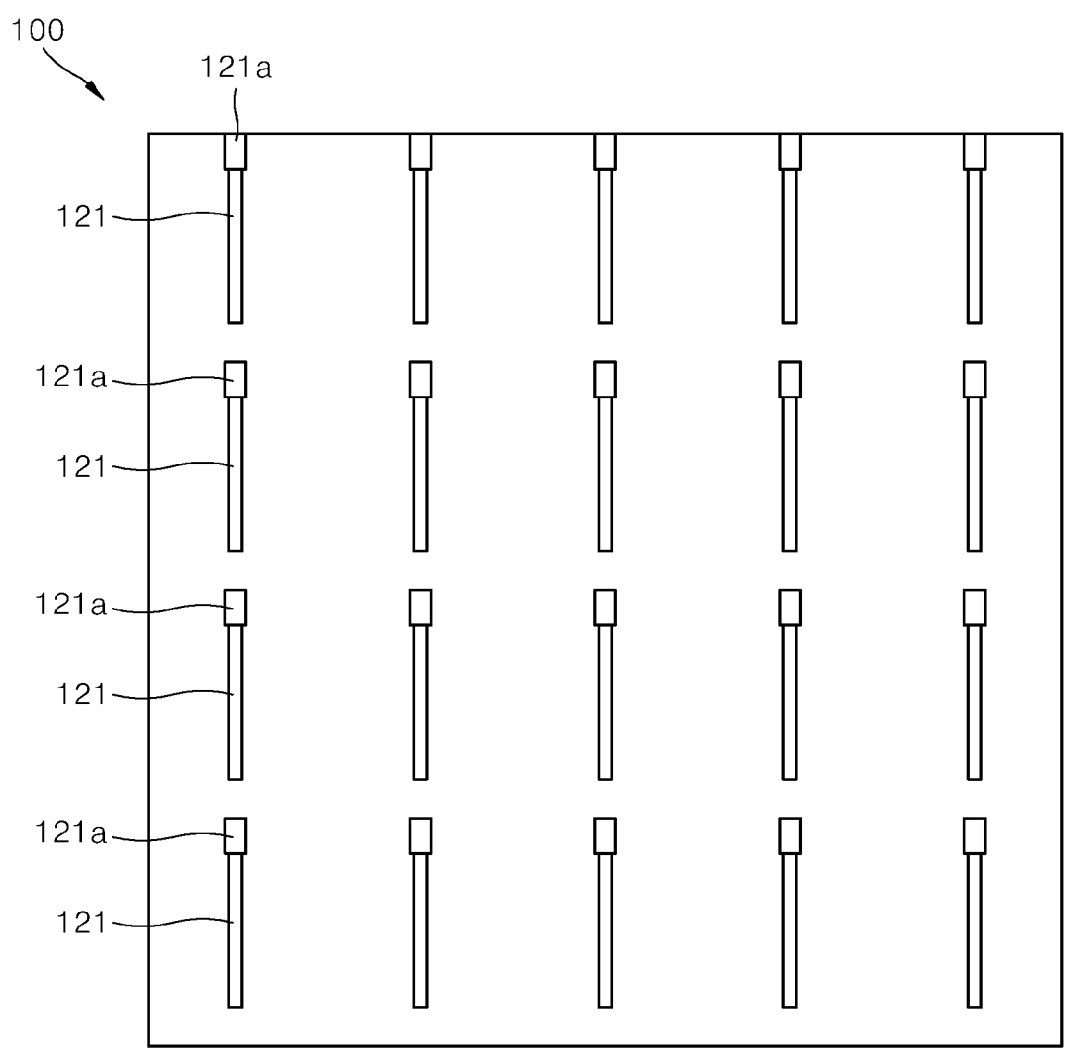
FIG. 22 is a plan view illustrating a rear surface of a solar cell applied to a solar cell module according to another embodiment of the present invention.

In addition, as shown in FIG. 22, an insertion portion 121a of an aluminum layer 130, which is formed to be less than or equal to a thickness of a rear busbar electrode 121 or is formed by removing the aluminum layer 130, may be continuously formed from an end of the rear busbar electrode 121 discontinuously formed when a solar cell 100 is divided into four. Alternatively, as shown in FIG. 19, the insertion portion 121a may be formed to be spaced apart from an end of the rear busbar electrode 121 by a certain distance.

Figure 21:
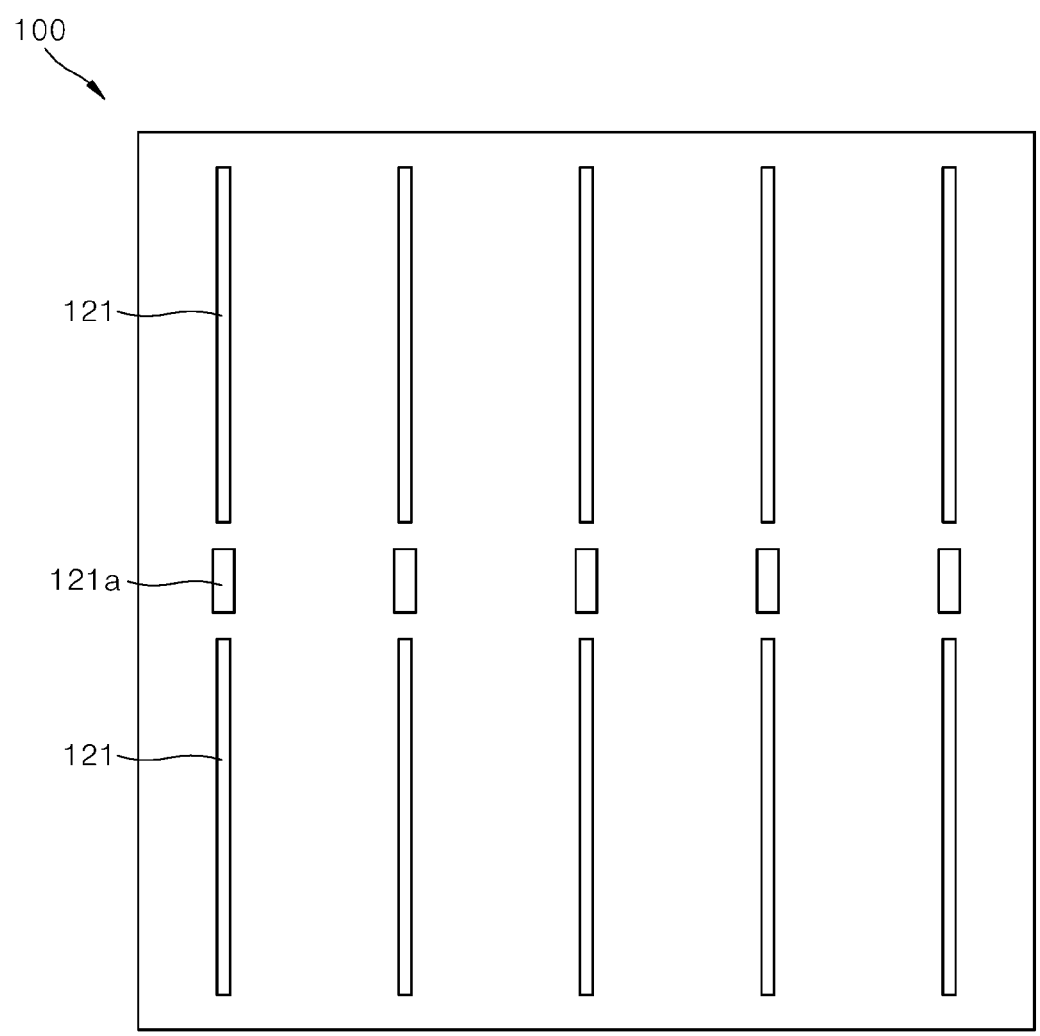
FIG. 21 is a plan view illustrating a rear surface of a solar cell applied to a solar cell module according to another embodiment of the present invention.

Furthermore, the insertion portion 121a formed so as to be continued or spaced apart from the rear busbar electrode by removing a portion of the aluminum layer is applied in FIGS. 20 to 22. However, as described with reference to FIG. 19, of course, in a region corresponding to the insertion portion 121a, the insertion groove may be formed by removing a portion of the solar cell 100, or the through-hole 121b may be formed to pass through the solar cell 100.

Although the solar cell module of the present invention has been described with reference to the accompanying drawings, the solar cell module is provided only for illustrative purposes, and it will be understood by one of ordinary skill in the art to which the present invention pertains that various modifications and other embodiments equivalent thereto can be made. Thus, the scope of the present invention should be defined by the technical idea of the appended claims.

The invention claimed is:

1. A solar cell module including a plurality of solar cells, comprising:
   a plurality of finger electrodes and a front busbar electrode which are formed on a front surface of each solar cell, wherein the front busbar electrode connects the finger electrodes;
   a rear busbar electrode which is formed on a rear surface of each solar cell; and
   an interconnection ribbon which connects the front busbar electrode of one side solar cell and the rear busbar electrode of the other side solar cell,
   wherein a plurality of the solar cells are disposed adjacent to each other in an extending direction of the front busbar electrode;
   wherein the solar cells are disposed such that an edge of a front surface of the one side solar cell partially overlaps an edge of a rear surface of the other side solar cell,
   wherein the rear busbar electrode of the solar cell is removed from an edge of the solar cell to a certain length,
   wherein an aluminum layer thicker than the rear busbar electrode is formed on a rear surface of the solar cell excluding the rear busbar electrode,
   wherein a partial region of the aluminum layer in a direction from the edge of the rear surface of the solar cell to the rear busbar electrode or a region of the aluminum layer between the edge of the rear surface of solar cell and an end of the rear busbar electrode is formed to have a thickness less than or equal to a thickness of the rear busbar electrode or is removed, and
   wherein an insertion groove or a through-hole is formed in an insertion region which is formed to have a thickness less than or equal to the thickness of the rear busbar electrode or is removed, wherein the insertion groove is recessed downward by a certain depth such that a portion of the interconnection ribbon is inserted thereinto.

2. The solar cell module of claim 1, wherein an original solar cell manufactured to have a set size is cut in a direction orthogonal to the extending direction of the front busbar electrode to form the plurality of solar cells.

3. The solar cell module of claim 1, wherein a support potion is further provided at the edge of the front surface of the one side solar cell to support the edge of the rear surface of the other side solar cell.

4. A solar cell module including a plurality of solar cells, comprising:
   a plurality of finger electrodes and a front busbar electrode which are formed on a front surface of each solar cell, wherein the front busbar electrode connects the finger electrodes;
   a rear busbar electrode which is formed on a rear surface of each solar cell; and
   an interconnection ribbon which connects the front busbar electrode of one side solar cell and the rear busbar electrode of the other side solar cell,
   wherein a plurality of the solar cells are disposed adjacent to each other in an extending direction of the front busbar electrode,
   wherein the solar cells are disposed such that an edge of a front surface of the one side solar cell partially overlaps an edge of a rear surface of the other side solar cell,
   wherein at least one end of both ends of the front busbar electrode is removed from an edge of the solar cell to a certain distance,
   wherein a pair of branch busbar electrodes are further provided on a front surface of the solar cell so as to be branched and extended by a certain length to the edge of the solar cell from the one end of the front busbar electrode which is removed to the certain length, and
   wherein an insertion groove or a through-hole is formed in the solar cell between the branch busbar electrodes, wherein the insertion groove is recessed downward by a certain depth such that a portion of the interconnection ribbon is inserted thereinto or the through-hole vertically passes through the solar cell such that the interconnection ribbon passes therethrough.

5. The solar cell module of claim 4, wherein an original solar cell manufactured to have a set size is cut in a direction orthogonal to the extending direction of the front busbar electrode to form the plurality of solar cells.

6. The solar cell module of claim 4, wherein a support potion is further provided at the edge of the front surface of the one side solar cell to support the edge of the rear surface of the other side solar cell.

* * * * *